(12) United States Patent
Suzuki et al.

(10) Patent No.: US 11,474,345 B2
(45) Date of Patent: Oct. 18, 2022

(54) MIRROR DEVICE

(71) Applicant: HAMAMATSU PHOTONICS K.K., Hamamatsu (JP)

(72) Inventors: Daiki Suzuki, Hamamatsu (JP); Takuma Osaki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 73 days.

(21) Appl. No.: 16/636,482

(22) PCT Filed: Aug. 3, 2018

(86) PCT No.: PCT/JP2018/029301
§ 371 (c)(1),
(2) Date: Feb. 4, 2020

(87) PCT Pub. No.: WO2019/031420
PCT Pub. Date: Feb. 14, 2019

(65) Prior Publication Data
US 2020/0249463 A1    Aug. 6, 2020

(30) Foreign Application Priority Data
Aug. 10, 2017  (JP) .............................. JP2017-155311

(51) Int. Cl.
*G02B 26/08*  (2006.01)
*B81B 3/00*  (2006.01)
(Continued)

(52) U.S. Cl.
CPC .............. *G02B 26/085* (2013.01); *B81B 3/00* (2013.01); *G02B 7/182* (2013.01); *G02B 26/0841* (2013.01); *G02B 26/10* (2013.01)

(58) Field of Classification Search
CPC .. G02B 26/085; G02B 7/182; G02B 26/0841; G02B 26/10; G02B 26/08; B81B 3/00;
(Continued)

(56) References Cited

U.S. PATENT DOCUMENTS 6,467,345 B1   10/2002  Neukermans et al.
7,619,802 B2   11/2009  Brown et al.
(Continued)

FOREIGN PATENT DOCUMENTS

CN   1920613 A    2/2007
CN   101426163    5/2009
(Continued)

OTHER PUBLICATIONS

International Preliminary Report On Patentability dated Feb. 20, 2020 for PCT/JP2018/029301.

*Primary Examiner* — Euncha P Cherry
(74) *Attorney, Agent, or Firm* — Faegre Drinker Biddle & Reath LLP

(57) ABSTRACT

A mirror device includes a support portion, a movable portion, and a pair of torsion bars disposed on both sides of the movable portion on a first axis. The movable portion includes a frame-shaped frame connected to the pair of torsion bars and a mirror unit disposed inside the frame. The mirror unit is connected to the frame in each of a pair of connection regions located on both sides of the mirror unit in a direction parallel to a second axis. A region other than the pair of connection regions in a region between the mirror unit and the frame is a space. An outer edge of the mirror unit and an inner edge of the frame are connected to each other so that a curvature in each of the pair of connection regions is continuous when viewed from a direction perpendicular to the first and the second axes.

52 Claims, 8 Drawing Sheets

(51) Int. Cl.
*G02B 7/182* (2021.01)
*G02B 26/10* (2006.01)

(58) Field of Classification Search
CPC ...... B81B 2201/042; B81B 2203/0109; B81B 3/0072
USPC ...................................................... 359/223.1
See application file for complete search history.

(56) References Cited

U.S. PATENT DOCUMENTS

| | | | |
|---|---|---|---|
| 2010/0259806 A1* | 10/2010 | Tauscher | G02B 26/101 359/198.1 |
| 2012/0062970 A1* | 3/2012 | Yamada | G02B 26/0858 359/199.4 |
| 2012/0162739 A1 | 6/2012 | Yamada | |
| 2012/0236384 A1 | 9/2012 | Mizoguchi | |
| 2013/0194555 A1 | 8/2013 | Davis et al. | |
| 2014/0104840 A1 | 4/2014 | Iseki | |
| 2017/0102538 A1* | 4/2017 | Gamet | G02B 26/085 |

FOREIGN PATENT DOCUMENTS

| | | |
|---|---|---|
| CN | 101750735 A | 6/2010 |
| CN | 103033931 A | 4/2013 |
| CN | 103840704 A | 6/2014 |
| CN | 105137597 A | 12/2015 |
| DE | 102012222988 A1 | 6/2014 |
| EP | 3029818 A1 | 6/2016 |
| JP | 2007-065649 A | 3/2007 |
| JP | 2012-133242 A | 7/2012 |
| JP | 2016-197265 A | 11/2016 |
| WO | WO 2013/168385 A1 | 11/2013 |
| WO | WO 2015/015666 A1 | 2/2015 |

* cited by examiner

Fig.7
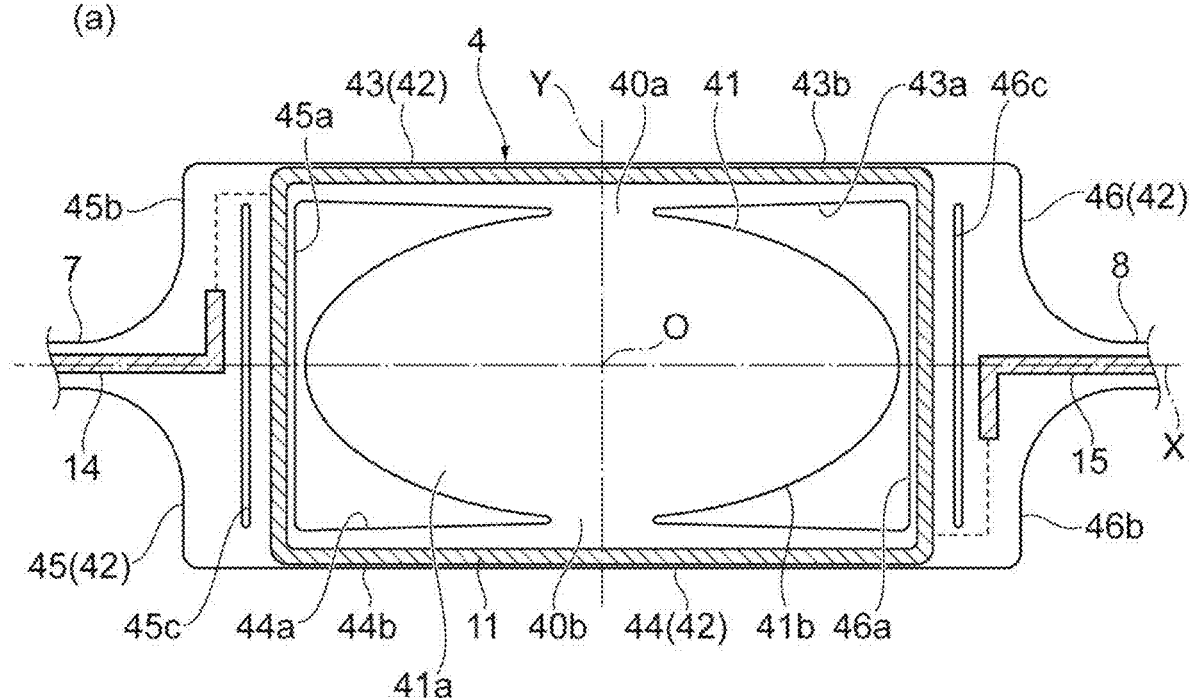
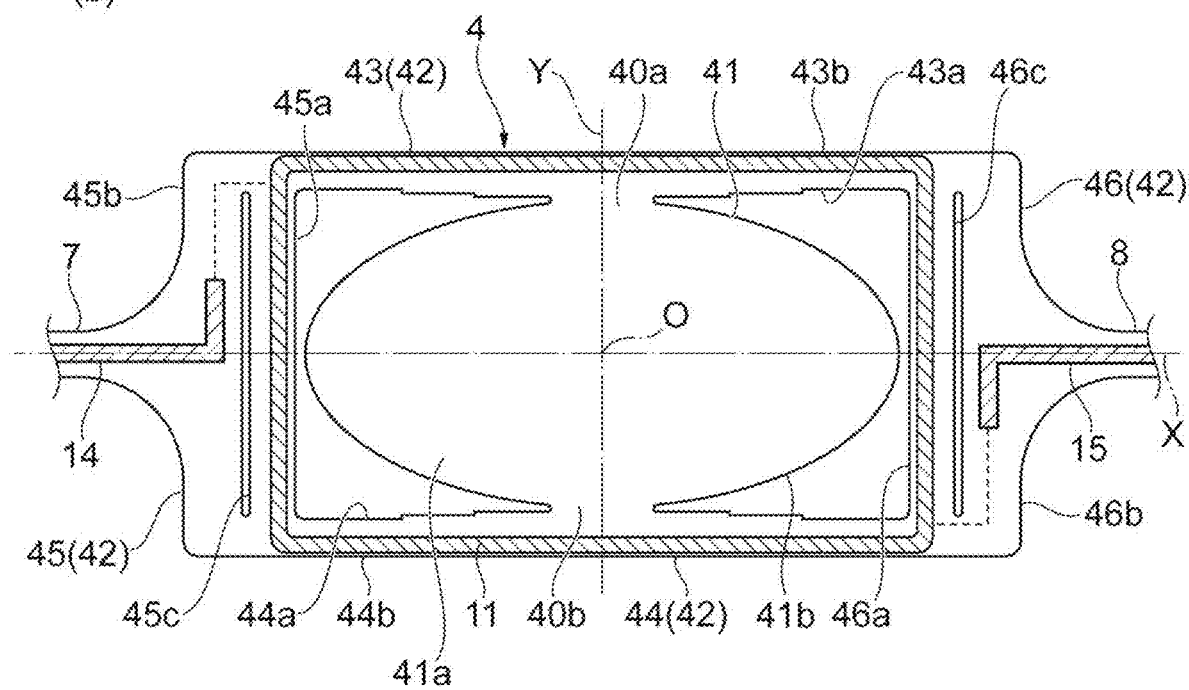

MIRROR DEVICE

TECHNICAL FIELD

The present disclosure relates to a mirror device configured as, for example, a Micro Electro Mechanical Systems (MEMS) device.

BACKGROUND ART

As a MEMS, there is known a mirror device including a support portion, a movable portion provided with a mirror unit, and a pair of torsion bars connecting the movable portion to the support portion so that the movable portion is swingable around a predetermined axis as a center line. In such a mirror device, in order to suppress the mirror unit from being bent when the movable portion is swung at a high speed (for example, a resonance frequency level of the movable portion (several KHz to several tens KHz)), there is a case in which the mirror unit in the movable portion is connected to a frame-shaped frame through a pair of connection portions disposed on the axis (for example, see Patent Literature 1).

CITATION LIST

Patent Literature

Patent Literature 1: U.S. Pat. No. 7,619,802

SUMMARY OF INVENTION

Technical Problem

In the above-described mirror device, since the pair of torsion bars and the pair of connection portions are disposed on the same axis, stress occurring in the pair of connection portions due to the twist of the pair of torsion bars increases when the movable portion is swung at a high speed. Accordingly, there is concern that the movable portion may be damaged in the connection portion.

An object of the present disclosure is to provide a mirror device capable of suppressing both bending of a mirror unit and damage of a movable portion.

Solution to Problem

A mirror device of an aspect of the present disclosure includes: a support portion; a movable portion; and a pair of torsion bars disposed on both sides of the movable portion on a first axis and connecting the movable portion to the support portion so that the movable portion is swingable around the first axis as a center line, in which the movable portion includes a frame-shaped frame connected to the pair of torsion bars and a mirror unit disposed inside the frame, in which the mirror unit is connected to the frame in each of a pair of first connection regions located on both sides of the mirror unit in a direction parallel to a second axis perpendicular to the first axis, in which a region other than the pair of first connection regions in a region between the mirror unit and the frame is a space, and in which an outer edge of the mirror unit and an inner edge of the frame are connected to each other so that a curvature in each of the pair of first connection regions is continuous when viewed from a direction perpendicular to the first axis and the second axis.

In the mirror device, the pair of torsion bars connected to the frame-shaped frame is disposed on the first axis and the pair of first connection regions in which the mirror unit and the frame-shaped frame are connected to each other is located on both sides of the mirror unit in a direction parallel to the second axis perpendicular to the first axis. Accordingly, even when the movable portion is swung at a high speed, stress occurring in each of the pair of first connection regions due to the twist of the pair of torsion bars becomes smaller than, for example, a case in which only the pair of connection regions is located on the first axis or a case in which the mirror unit and the frame-shaped frame are connected to each other only in one connection region. Furthermore, in the mirror device, the outer edge of the mirror unit and the inner edge of the frame are connected to each other so that the curvature in each of the pair of first connection regions is continuous when viewed from a direction perpendicular to the first axis and the second axis. Accordingly, stress concentration hardly occurs in each of the pair of first connection regions. As described above, according to the mirror device, both the bending of the mirror unit and the damage of the movable portion can be suppressed.

A mirror device of an aspect of the present disclosure includes: a support portion; a movable portion; and a pair of torsion bars disposed on both sides of the movable portion on a first axis and connecting the movable portion to the support portion so that the movable portion is swingable around the first axis as a center line, in which the movable portion includes a frame-shaped frame connected to the pair of torsion bars and a mirror unit disposed inside the frame, in which the mirror unit is connected to the frame in each of a pair of first connection regions located on both sides of the mirror unit in a direction parallel to a second axis perpendicular to the first axis and each of a pair of second connection regions located on both sides of the mirror unit in a direction parallel to the first axis, in which a region other than the pair of first connection regions and the pair of second connection regions in a region between the mirror unit and the frame is a space, and in which an outer edge of the mirror unit and an inner edge of the frame are connected to each other so that a curvature in each of the pair of first connection regions is continuous when viewed from a direction perpendicular to the first axis and the second axis.

In the mirror device, the pair of torsion bars connected to the frame-shaped frame is disposed on the first axis and the pair of first connection regions in which the minor unit and the frame-shaped frame are connected to each other is located on both sides of the mirror unit in a direction parallel to the second axis perpendicular to the first axis. Furthermore, the pair of second connection regions in which the mirror unit and the frame-shaped frame are connected to each other is located on both sides of the minor unit in a direction parallel to the first axis. Accordingly, even when the movable portion is swung at a high speed, stress occurring in each of the pair of first connection regions and the pair of second connection regions due to the twist of the pair of torsion bars becomes smaller than, for example, a case in which only the pair of connection regions is located on the first axis or a case in which the minor unit and the frame-shaped frame are connected to each other only in one connection region. Furthermore, in the mirror device, the outer edge of the minor unit and the inner edge of the frame are connected to each other so that the curvature in each of the pair of first connection regions is continuous when viewed from a direction perpendicular to the first axis and the second axis. Accordingly, stress concentration hardly occurs in each of the pair of first connection regions. As described above, according to the mirror device, both the bending of the mirror unit and the damage of the movable portion can be suppressed.

In the mirror device of an aspect of the present disclosure, the outer edge of the mirror unit and the inner edge of the frame may be connected to each other so that a curvature in each of the pair of second connection regions is continuous when viewed from a direction perpendicular to the first axis and the second axis. Accordingly, stress concentration hardly occurs in each of the pair of second connection regions.

In the mirror device of an aspect of the present disclosure, the pair of second connection regions may be located on both sides of the mirror unit on the first axis. Accordingly, the inertia moment of the movable portion around the first axis can be decreased.

In the mirror device of an aspect of the present disclosure, the pair of first connection regions may be located on both sides of the mirror unit on the second axis. Accordingly, a sufficient distance between each of the pair of torsion bars and each of the pair of first connection regions (a distance that the influence of the twist of the pair of torsion bars hardly reaches each of the pair of first connection regions) can be secured. Thus, both the bending of the mirror unit and the damage of the movable portion can be suppressed while simplifying the configuration of the movable portion.

In the mirror device of an aspect of the present disclosure, the frame may include a pair of first portions connected to the mirror unit and extending in a direction parallel to the first axis and a width of each of the pair of first portions in a direction parallel to the second axis may become smaller as it goes away from each of the pair of first connection region. Accordingly, stress due to the twist of the pair of torsion bars is dispersed in the portion of which the width is smaller than that of each of the pair of first portions so that stress occurring in each of the pair of first connection regions can be further decreased. Furthermore, it is possible to decrease the inertia moment of the movable portion as the width of each of the pair of first portions decreases while securing the connection strength of each of the pair of first connection regions. It is advantageous to decrease the inertia moment of the movable portion when swinging the movable portion at a high speed.

In the mirror device of an aspect of the present disclosure, the frame may further include a pair of second portions connected to the pair of torsion bars and extending in a direction parallel to the second axis. Accordingly, stress due to the twist of the pair of torsion bars is dispersed in the portion between the first portion and the second portion connected or coupled to each other so that stress occurring in each of the pair of first connection regions can be further decreased.

In the mirror device of an aspect of the present disclosure, an inner edge of each of the pair of first portions and an inner edge of each of the pair of second portions may be connected to each other so that a curvature in each of a plurality of connection regions is continuous when viewed from a direction perpendicular to the first axis and the second axis. Accordingly, the occurrence of stress concentration can be suppressed in each of the plurality of connection regions in which the inner edge of each of the pair of first portions and the inner edge of each of the pair of second portions are connected to each other.

In the mirror device of an aspect of the present disclosure, an outer edge of each of the pair of first portions and an outer edge of each of the pair of second portions may be connected to each other so that a curvature in each of a plurality of connection regions is continuous when viewed from a direction perpendicular to the first axis and the second axis. Accordingly, the occurrence of stress concentration can be suppressed in each of the plurality of connection regions in which the outer edge of each of the pair of first portions and the outer edge of each of the pair of second portions are connected to each other.

In the mirror device of an aspect of the present disclosure, a length of each of the pair of first portions in a direction parallel to the first axis may be longer than a length of each of the pair of second portions in a direction parallel to the second axis. Accordingly, a sufficient distance between each of the pair of torsion bars and each of the pair of first connection regions (a distance that the influence of the twist of the pair of torsion bars hardly reaches each of the pair of first connection regions) can be secured while suppressing an increase in the inertia moment of the movable portion.

In the mirror device of an aspect of the present disclosure, a distance between each of the pair of first connection regions and one of the pair of second portions and a distance between each of the pair of first connection regions and the other of the pair of second portions may be longer than a distance between the first axis and each of the pair of first portions. Accordingly, a sufficient distance between each of the pair of torsion bars and each of the pair of first connection regions (a distance that the influence of the twist of the pair of torsion bars hardly reaches each of the pair of first connection regions) can be secured while suppressing an increase in the inertia moment of the movable portion.

In the mirror device of an aspect of the present disclosure, a shape of the mirror unit when viewed from a direction perpendicular to the first axis and the second axis may be an ellipse having a major axis along the first axis. Accordingly, a sufficient area of the mirror surface can be secured while suppressing an increase in the inertia moment of the movable portion.

In the mirror device of an aspect of the present disclosure, a width of each of the pair of first connection regions in a direction parallel to the first axis may be 30% or less of a width of the mirror unit in a direction parallel to the first axis. Accordingly, it is possible to secure a sufficient connection strength between the mirror unit and the frame and a sufficient distance between each of the pair of torsion bars and each of the pair of first connection regions at the same time.

Advantageous Effects of Invention

According to the present disclosure, it is possible to provide a mirror device capable of suppressing both bending of a mirror unit and damage of a movable portion.

BRIEF DESCRIPTION OF DRAWINGS

FIG. 7 is (a) a plan view of a movable portion of a first modified example and (b) a plan view of a movable portion of a second modified example.

DESCRIPTION OF EMBODIMENTS

Figure 1:
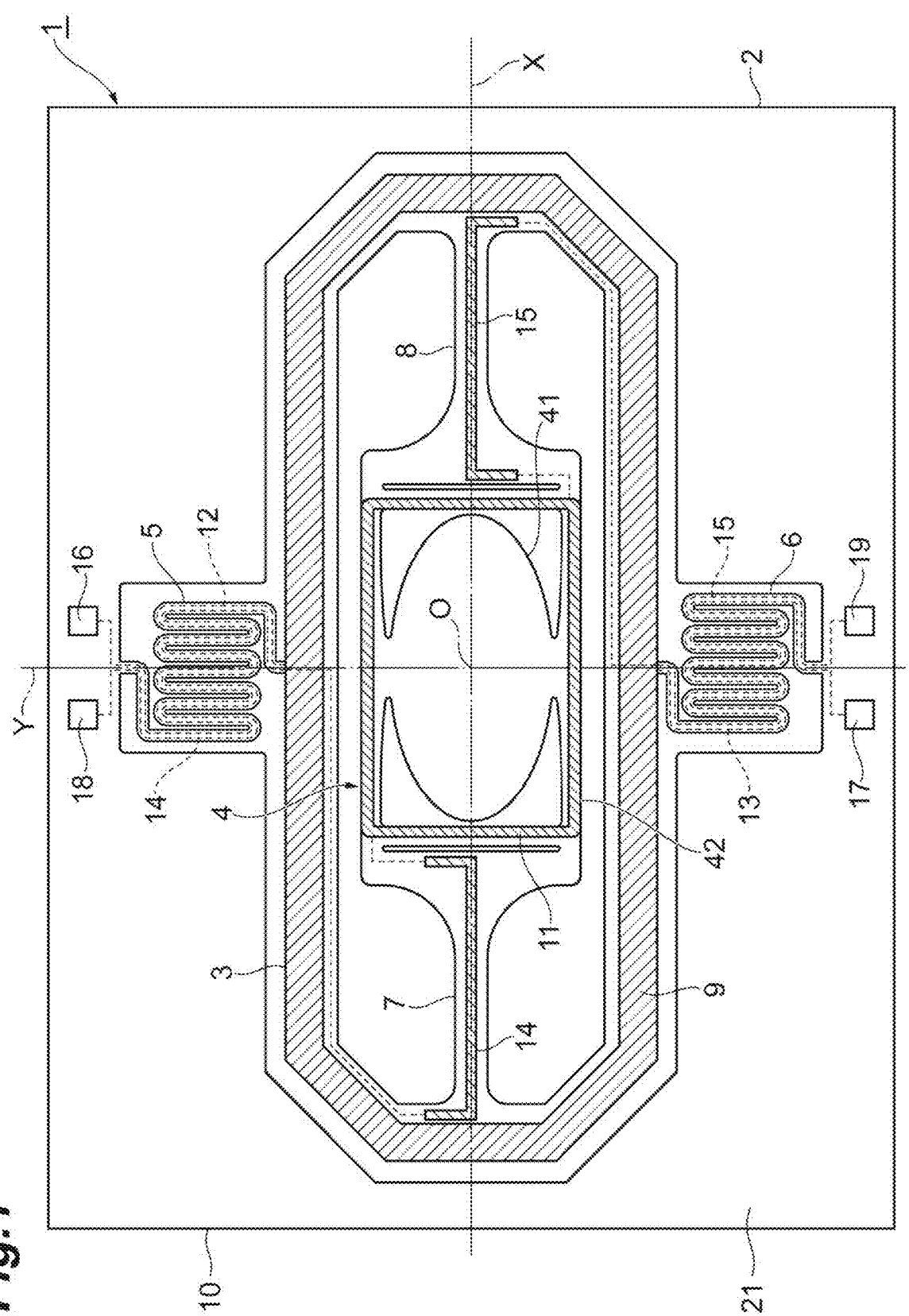
FIG. 1 is a plan view of a mirror device of an embodiment.

Hereinafter, an embodiment of the present disclosure will be described in detail with reference to the drawings. Additionally, in the drawings, the same reference numerals will be given to the same or equivalent parts and a redundant description will be omitted.

Configuration of Mirror Device

As illustrated in FIG. 1, a mirror device 1 includes a base 2, a support portion 3, a movable portion 4, a pair of torsion bars 5 and 6, a pair of torsion bars 7 and 8, and a magnetic field generator 10. The base 2, the support portion 3, the movable portion 4, the pair of torsion bars 5 and 6, and the pair of torsion bars 7 and 8 are integrally formed by a Silicon on Insulator (SOT) substrate. That is, the mirror device 1 is configured as a MEMS device. The magnetic field generator 10 is configured by, for example, a permanent magnet having a Halbach array. In the mirror device 1, the movable portion 4 provided with a mirror unit 41 is swung around each of an X axis (a first axis) and a Y axis (a second axis perpendicular to the first axis) as a center line. The mirror device 1 is used for, for example, an optical switch for optical communication, an optical scanner, and the like.

The base 2 has, for example, a rectangular outer shape when viewed from a direction perpendicular to the X axis and the Y axis and is formed in a frame shape. The base 2 is disposed at one side of the magnetic field generator 10. The support portion 3 has, for example, an octagonal outer shape when viewed from a direction perpendicular to the X axis and the Y axis and is formed in a frame shape. The support portion 3 is disposed inside the base 2 while being separated from the magnetic field generator 10. The movable portion 4 has, for example, a rectangular outer shape when viewed from a direction perpendicular to the X axis and the Y axis. The movable portion 4 is disposed inside the support portion 3 while being separated from the magnetic field generator 10.

The pair of torsion bars 5 and 6 is disposed on both sides of the support portion 3 on the Y axis. The pair of torsion bars 5 and 6 connects the support portion 3 to the base 2 so that the support portion 3 is swingable around the Y axis as a center line. Each of the torsion bars 5 and 6 extends in a meandering shape in order to improve strength and easily adjust a torsion spring constant. The pair of torsion bars 7 and 8 is disposed on both sides of the movable portion 4 on the X axis. The pair of torsion bars 7 and 8 connects the movable portion 4 to the support portion 3 so that the movable portion 4 is swingable around the X axis as a center line. Each of the torsion bars 7 and 8 extends in a linear shape along the X axis.

The mirror device 1 further includes a coil 9, a coil 11, a plurality of wires 12, 13, 14, and 15, and a plurality of electrode pads 16, 17, 18, and 19. The coil 9 is provided in the support portion 3. The coil 9 extends in, for example, a spiral shape while being embedded in the support portion 3. The coil 11 is provided in the movable portion 4. The coil 9 extends in, for example, a spiral shape while being embedded in the movable portion 4. Each of the coils 9 and 11 is formed of, for example, a metal material such as copper. Additionally, in the drawings, a region in which each of the coils 9 and 11 is disposed is indicated by hatching.

The plurality of electrode pads 16, 17, 18, and 19 are provided in the base 2. Each of the electrode pads 16, 17, 18, and 19 is exposed from the insulation layer 21 in the base 2 to the outside. The insulation layer 21 is integrally formed so as to cover the surfaces of the base 2, the support portion 3, the movable portion 4, the pair of torsion bars 5 and 6, and the pair of torsion bars 7 and 8 (the surfaces opposite to the magnetic field generator 10). The insulation layer 21 is formed by, for example, a silicon dioxide film, a silicon nitride film, or the like.

The wire 12 electrically connects one end of the coil 9 to the electrode pad 16. The wire 12 extends from one end of the coil 9 to the electrode pad 16 through the torsion bar 5 while being embedded in the insulation layer 21. The wire 13 electrically connects the other end of the coil 9 to the electrode pad 17. The wire 13 extends from the other end of the coil 9 to the electrode pad 17 through the torsion bar 6 while being embedded in the insulation layer 21. Each of the wires 12 and 13 is formed of, for example, a metal material such as aluminum.

The wire 14 electrically connects one end of the coil 11 to the electrode pad 18. The wire 14 extends from one end of the coil 11 to the electrode pad 18 through the torsion bar 7, a part of the support portion 3, and the torsion bar 5 while being embedded in the insulation layer 21. The wire 15 electrically connects the other end of the coil 11 to the electrode pad 19. The wire 15 extends from the other end of the coil 11 to the electrode pad 19 through the torsion bar 8, a part of the support portion 3, and the torsion bar 6 while being embedded in the insulation layer 21. A portion passing through each of the torsion bars 7 and 8 in each of the wires 14 and 15 is formed of, for example, a metal material such as tungsten and the other portions are formed of a metal material such as aluminum. As will be described later, since torsion associated with the resonance of the movable portion 4 at the natural frequency occurs in the pair of torsion bars 7 and 8, the load applied to the portion passing through each of the torsion bars 7 and 8 in each of the wires 14 and 15 is larger than that of the other portions. However, in the mirror device 1, since the portion passing through each of the torsion bars 7 and 8 in each of the wires 14 and 15 is formed of a metal material having Vickers hardness larger than that of the other portions, metal fatigue hardly occurs in each of the wires 14 and 15 on each of the torsion bars 7 and 8. Additionally, in the drawings, a portion passing through each of the torsion bars 7 and 8 in each of the wires 14 and 15 is indicated by hatching.

In the mirror device 1 with the above-described configuration, when a drive signal for a linear operation is input to the coil 9 through the electrode pads 16 and 17 and the wires 12 and 13, a Lorentz force acts on the coil 9 by interaction with the magnetic field generated by the magnetic field generator 10. By using a balance between the Lorentz force and the elastic force of the pair of torsion bars 5 and 6, the mirror unit 41 can be operated linearly along with the support portion 3 while using the Y axis as a center line. Meanwhile, when a drive signal for a resonance operation is input to the coil 11 through the electrode pads 18 and 19 and the wires 14 and 15, a Lorentz force acts on the coil 11 by interaction with the magnetic field generated by the magnetic field generator 10. By using the resonance of the movable portion 4 at the natural frequency in addition to the Lorentz force, the mirror unit 41 can resonate while using the X axis as a center line. Additionally, the natural frequency is determined by the inertia moment of the movable portion 4, the torsion spring constants of the pair of torsion bars 7 and 8, or the like.

Configuration of Each Component

Figure 2:
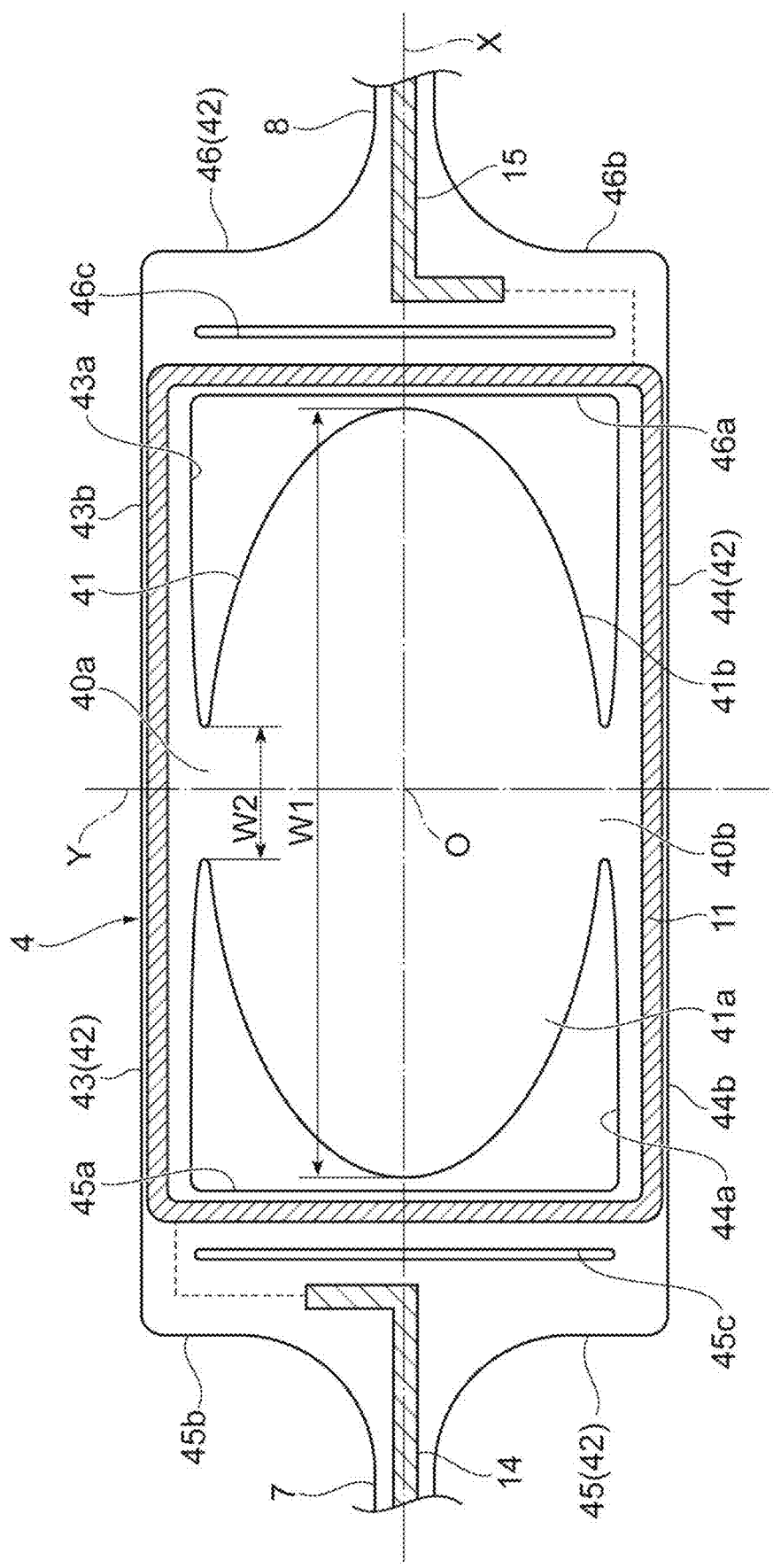
FIG. 2 is a plan view of a movable portion of the mirror device illustrated in FIG. 1.

As illustrated in FIG. 2, the movable portion 4 includes a frame-shaped frame 42 in addition to the mirror unit 41. The pair of torsion bars 7 and 8 is connected to the frame 42. The mirror unit 41 is disposed inside the frame 42. The mirror unit 41 is connected to the frame 42 of each of a pair of connection regions (first connection regions) 40a and 40b located on both sides of the mirror unit 41 in a direction (hereinafter, referred to as a "Y-axis direction") parallel to the Y axis. More specifically, the mirror unit 41 is connected to the frame 42 of each of the pair of connection regions 40a and 40b located on both sides of the mirror unit 41 on the Y axis. A region other than the pair of connection regions 40a and 40b in a region between the mirror unit 41 and the frame 42 is a space. That is, the mirror unit 41 and the frame 42 are connected to each other only in the pair of connection regions 40a and 40b. A width (minimum width) W2 of each of the connection regions 40a and 40b in a direction (hereinafter, referred to as an "X-axis direction") parallel to the X axis is 30% or less of a width (a maximum width) W1 of the mirror unit 41 in the X-axis direction.

The shape of the mirror unit 41 when viewed from a direction perpendicular to the X axis and the Y axis is an ellipse having a major axis along the X axis and a minor axis along the Y axis centered at the intersection O between the X axis and the Y axis. A mirror surface 41a is formed on the surface of the mirror unit 41 (the surface opposite to the magnetic field generator 10) by, for example, a metal film formed of aluminum or the like.

The frame 42 has, for example, a rectangular outer shape when viewed from a direction perpendicular to the X axis and the Y axis and is formed in a frame shape. More specifically, the frame 42 is formed in a frame shape by a pair of first portions 43 and 44 extending in the X-axis direction and a pair of second portions 45 and 46 extending in the Y-axis direction. The length of each of the first portions 43 and 44 in the X-axis direction is longer than the length of each of the second portions 45 and 46 in the Y-axis direction. Additionally, the length of each of the first portions 43 and 44 in the X-axis direction can be regarded as the length of the outer edge or the inner edge of each of the first portions 43 and 44 when viewed from a direction perpendicular to the X axis and the Y axis. The length of each of the second portions 45 and 46 in the Y-axis direction can be regarded as the length of the outer edge or the inner edge of each of the second portions 45 and 46 when viewed from a direction perpendicular to the X axis and the Y axis.

Each of the distance between the connection region 40a and the second portion 45, the distance between the connection region 40a and the second portion 46, the distance between the connection region 40b and the second portion 45, and the distance between the connection region 40b and the second portion 46 is longer than each of the distance between the X axis and the first portion 43 and the distance between the X axis and the first portion 44. Additionally, the distance between the connection region 40a and the second portion 45 can be regarded as the distance (the maximum distance) from the outer edge on the side of the second portion 45 in the connection region 40a to the inner edge of the second portion 45 in the X-axis direction. The distance between the connection region 40a and the second portion 46 can be regarded as the distance (the maximum distance) from the outer edge on the side of the second portion 46 in the connection region 40a to the inner edge of the second portion 46 in the X-axis direction. The distance between the connection region 40b and the second portion 45 can be regarded as the distance (the maximum distance) from the outer edge on the side of the second portion 45 in the connection region 40b to the inner edge of the second portion 45 in the X-axis direction. The distance between the connection region 40b and the second portion 46 can be regarded as the distance (the maximum distance) from the outer edge on the side of the second portion 46 in the connection region 40b to the inner edge of the second portion 46 in the X-axis direction. The distance between the X axis and the first portion 43 can be regarded as the distance (the maximum distance) from the X axis to the inner edge of the first portion 43 in the Y-axis direction. The distance between the X axis and the first portion 44 can be regarded as the distance (the maximum distance) from the X axis to the inner edge of the first portion 44 in the Y-axis direction.

The mirror unit 41 is connected to a side surface 43a on the inside (the side of the mirror unit 41) of the first portion 43 and a side surface 44a on the inside (the side of the mirror unit 41) of the first portion 44. The torsion bar 7 is connected to a side surface 45b on the outside (the side opposite to the mirror unit 41) of the second portion 45. The torsion bar 8 is connected to a side surface 46b on the outside (the side opposite to the mirror unit 41) of the second portion 46.

A side surface 41b of the mirror unit 41 and the side surface 43a on the inside of the first portion 43 are connected to each other so that the curvature in the connection region 40a is continuous. The side surface 41b of the mirror unit 41 and the side surface 44a on the inside of the first portion 44 are connected to each other so that the curvature in the connection region 40b is continuous. That is, the outer edge of the mirror unit 41 and the inner edge of the frame 42 are connected to each other so that the curvature in each of the connection regions 40a and 40b is continuous when viewed from a direction perpendicular to the X axis and the Y axis. Additionally, the "connection with the continuous curvature" means the connection without any point (for example, an apex of a sharp corner (including acute, right, and obtuse angles)) in which the curvature is not continuous. Thus, when there is not any point that the curvature is not continuous, a linear portion may be included in the outer edge of the mirror unit 41 and the inner edge of the frame 42 in each of the connection regions 40a and 40b (the value of the curvature of the linear portion can be regarded as zero).

The width of the first portion 43 in the Y-axis direction becomes smaller as it goes closer to the torsion bar 7 from the connection region 40a in the X-axis direction and as it goes closer to the torsion bar 8 from the connection region 40a in the X-axis direction. That is, the width of the first portion 43 in the Y-axis direction becomes smaller as it goes away from the connection region 40a. Here, a side surface 43b on the outside (the side opposite to the mirror unit 41) of the first portion 43 becomes a flat surface parallel to the X axis and the side surface 43a on the inside of the first portion 43 becomes a curved surface curved in a concave shape toward the side opposite to the mirror unit 41 so as to be closer to the side surface 43b as it goes away from the connection region 40a. The width of the first portion 44 in the Y-axis direction becomes smaller as it goes closer to the torsion bar 7 from the connection region 40b in the X-axis direction and as it goes closer to the torsion bar 8 from the connection region 40b in the X-axis direction. That is, the width of the first portion 44 in the Y-axis direction becomes smaller as it goes away from the connection region 40*b*. Here, a side surface 44*b* on the outside (the side opposite to the mirror unit 41) of the first portion 44 becomes a flat surface parallel to the X axis and the side surface 44*a* on the inside of the first portion 44 becomes a curved surface curved in a concave shape toward the side opposite to the mirror unit 41 so as to be closer to the side surface 44*b* as it goes away from the connection region 40*b*.

The side surface 43*a* on the inside of the first portion 43 and a side surface 45*a* on the inside (the side of the mirror unit 41) of the second portion 45 are connected to each other so that the curvature in the connection region is continuous when viewed from a direction perpendicular to the X axis and the Y axis. The side surface 43*a* on the inside of the first portion 43 and a side surface 46*a* on the inside (the side of the mirror unit 41) in the second portion 46 are connected to each other so that the curvature in the connection region is continuous when viewed from a direction perpendicular to the X axis and the Y axis. The side surface 44*a* on the inside of the first portion 44 and the side surface 45*a* on the inside of the second portion 45 are connected to each other so that the curvature in the connection region is continuous when viewed from a direction perpendicular to the X axis and the Y axis. The side surface 44*a* on the inside of the first portion 44 and the side surface 46*a* on the inside of the second portion 46 are connected to each other so that the curvature in the connection region is continuous when viewed from a direction perpendicular to the X axis and the Y axis. That is, the inner edge of each of the first portions 43 and 44 and the inner edge of each of the second portions 45 and 46 are connected to each other so that the curvature in each connection region is continuous when viewed from a direction perpendicular to the X axis and the Y axis.

The side surface 43*b* on the outside of the first portion 43 and the side surface 45*b* on the outside of the second portion 45 are connected to each other so that the curvature in the connection region is continuous when viewed from a direction perpendicular to the X axis and the Y axis. The side surface 43*b* on the outside of the first portion 43 and the side surface 46*b* on the outside of the second portion 46 are connected to each other so that the curvature in the connection region is continuous when viewed from a direction perpendicular to the X axis and the Y axis. The side surface 44*b* on the outside of the first portion 44 and the side surface 45*b* on the outside of the second portion 45 are connected to each other so that the curvature in the connection region is continuous when viewed from a direction perpendicular to the X axis and the Y axis. The side surface 44*b* on the outside of the first portion 44 and the side surface 46*b* on the outside of the second portion 46 are connected to each other so that the curvature in the connection region is continuous when viewed from a direction perpendicular to the X axis and the Y axis. That is, the outer edge of each of the first portions 43 and 44 and the outer edge of each of the second portions 45 and 46 are connected to each other so that the curvature in each connection region is continuous when viewed from a direction perpendicular to the X axis and the Y axis.

The second portion 45 is provided with a slit 45*c* which extends in the Y-axis direction. The slit 45*c* is located between the torsion bar 7 and the mirror unit 41 when viewed from a direction perpendicular to the X axis and the Y axis. The second portion 46 is provided with a slit 46*c* which extends in the Y-axis direction. The slit 46*c* is located between the torsion bar 8 and the mirror unit 41 when viewed from a direction perpendicular to the X axis and the Y axis.

The coil 11 extends along each of the side surfaces 43*b* and 44*b* on the outside of the first portions 43 and 44. The center position of the extension region of the coil 11 in the first portion 43 (the center position of the width in the Y-axis direction) is located on the outside (the side opposite to the connection region 40*a*) in relation to the center position of the first portion 43 (the center position of the width in the Y-axis direction). The center position of the extension region of the coil 11 in the first portion 44 (the center position of the width in the Y-axis direction) is located on the outside (the side opposite to the connection region 40*b*) in relation to the center position of the first portion 44 (the center position of the width in the Y-axis direction).

The coil 11 extends along each of the side surfaces 45*a* and 46*a* on the inside of the second portions 45 and 46. The center position of the extension region of the coil 11 in the second portion 45 (the center position of the width in the X-axis direction) is located on the inside (the side opposite to the torsion bar 7) (here, the inside in relation to the slit 45*c*) in relation to the center position of the second portion 45 (the center position of the width in the X-axis direction). The center position of the extension region of the coil 11 in the second portion 46 (the center position of the width in the X-axis direction) is located on the inside (the side opposite to the torsion bar 8) (here, the inside in relation to the slit 46*c*) in relation to the center position of the second portion 46 (the center position of the width in the X-axis direction).

Figure 3:
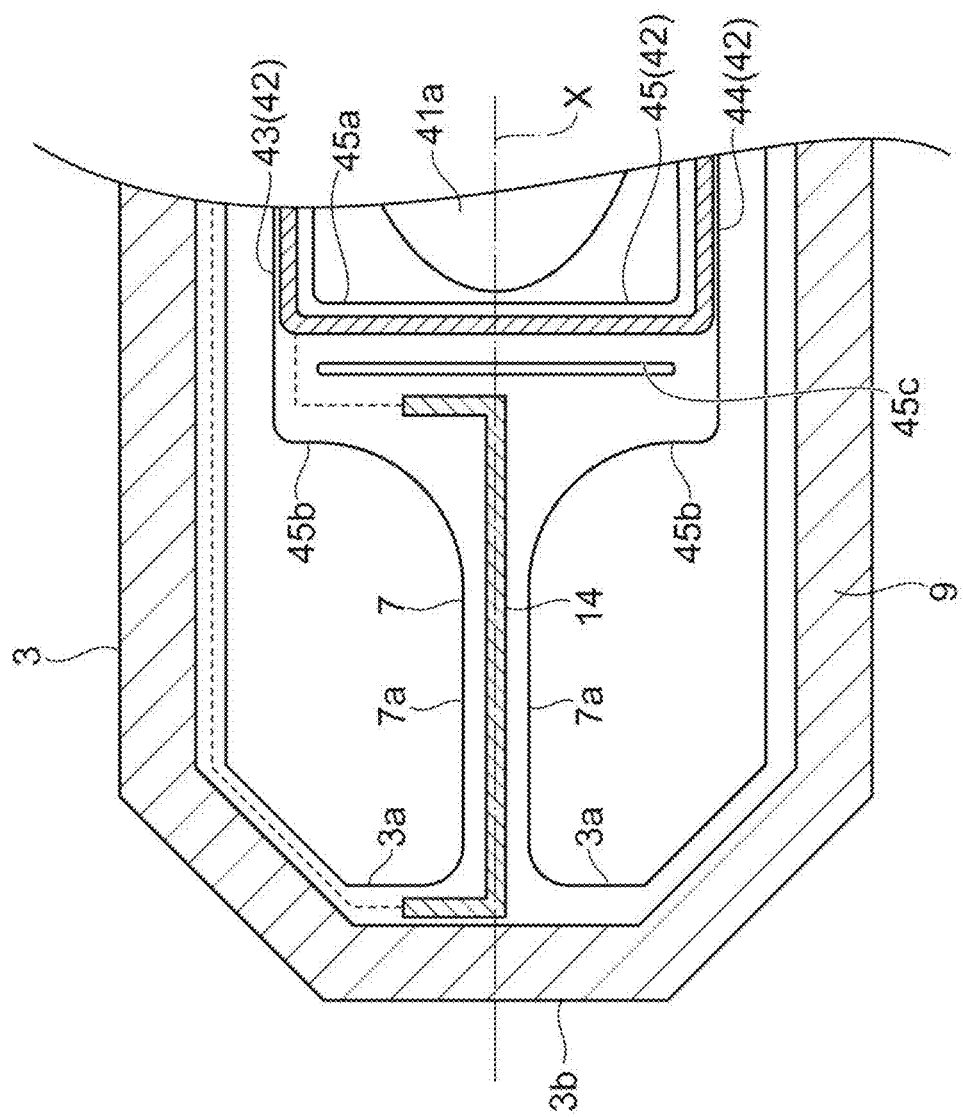
FIG. 3 is a plan view of a torsion bar of the mirror device illustrated in FIG. 1.

As illustrated in FIG. 3, the side surfaces 7*a* on both sides of the torsion bar 7 and the side surface 45*b* on the outside of the second portion 45 are connected to each other so that the curvature in each connection region is continuous when viewed from a direction perpendicular to the X axis and the Y axis. That is, the outer edge of the torsion bar 7 and the outer edge of the second portion 45 are connected to each other so that the curvature in each connection region is continuous when viewed from a direction perpendicular to the X axis and the Y axis. The side surfaces 7*a* on both sides of the torsion bar 7 and the side surface 3*a* on the inside (the side of the mirror unit 41) of the support portion 3 are connected to each other so that the curvature is continuous when viewed from a direction perpendicular to the X axis and the Y axis. That is, the outer edge of the torsion bar 7 and the inner edge of the support portion 3 are connected to each other so that the curvature in each connection region is continuous when viewed from a direction perpendicular to the X axis and the Y axis. The curvature of the outer edge of the torsion bar 7 in a region connected to the outer edge of the second portion 45 is smaller than the curvature of the outer edge of the torsion bar 7 in a region connected to the inner edge of the support portion 3.

Similarly, the side surfaces on both sides of the torsion bar 8 and the side surface 46*b* on the outside of the second portion 46 are connected to each other so that the curvature in each connection region is continuous when viewed from a direction perpendicular to the X axis and the Y axis (see FIGS. 1 and 2). That is, the outer edge of the torsion bar 8 and the outer edge of the second portion 46 are connected to each other so that the curvature in each connection region is continuous when viewed from a direction perpendicular to the X axis and the Y axis. The side surfaces on both sides of the torsion bar 8 and the side surface 3*a* on the inside of the support portion 3 are connected to each other so that the curvature in each connection region is continuous when viewed from a direction perpendicular to the X axis and the Y axis (see FIGS. 1 and 2). That is, the outer edge of the torsion bar 8 and the inner edge of the support portion 3 are connected to each other so that the curvature in each connection region is continuous when viewed from a direction perpendicular to the X axis and the Y axis. The curvature of the outer edge of the torsion bar 8 in a region connected to the outer edge of the second portion 46 is smaller than the curvature of the outer edge of the torsion bar 8 in a region connected to the inner edge of the support portion 3 (see FIGS. 1 and 2).

As illustrated in FIG. 3, the coil 9 extends along the side surface 3b on the outside (the side opposite to the mirror unit 41) of the support portion 3. The center position (the center position of the width in the X-axis direction) of the extension region of the coil 9 in the portion connected to the torsion bar 7 in the support portion 3 is located on the outside (the side opposite to the torsion bar 7) in relation to the center position (the center position of the width in the X-axis direction) of the corresponding portion. The center position (the center position of the width in the X-axis direction) of the extension region of the coil 9 in the portion connected to the torsion bar 8 in the support portion 3 is located on the outside (the side opposite to the torsion bar 8) in relation to the center position (the center position of the width in the X-axis direction) of the corresponding portion (see FIGS. 1 and 2).

Figure 4:
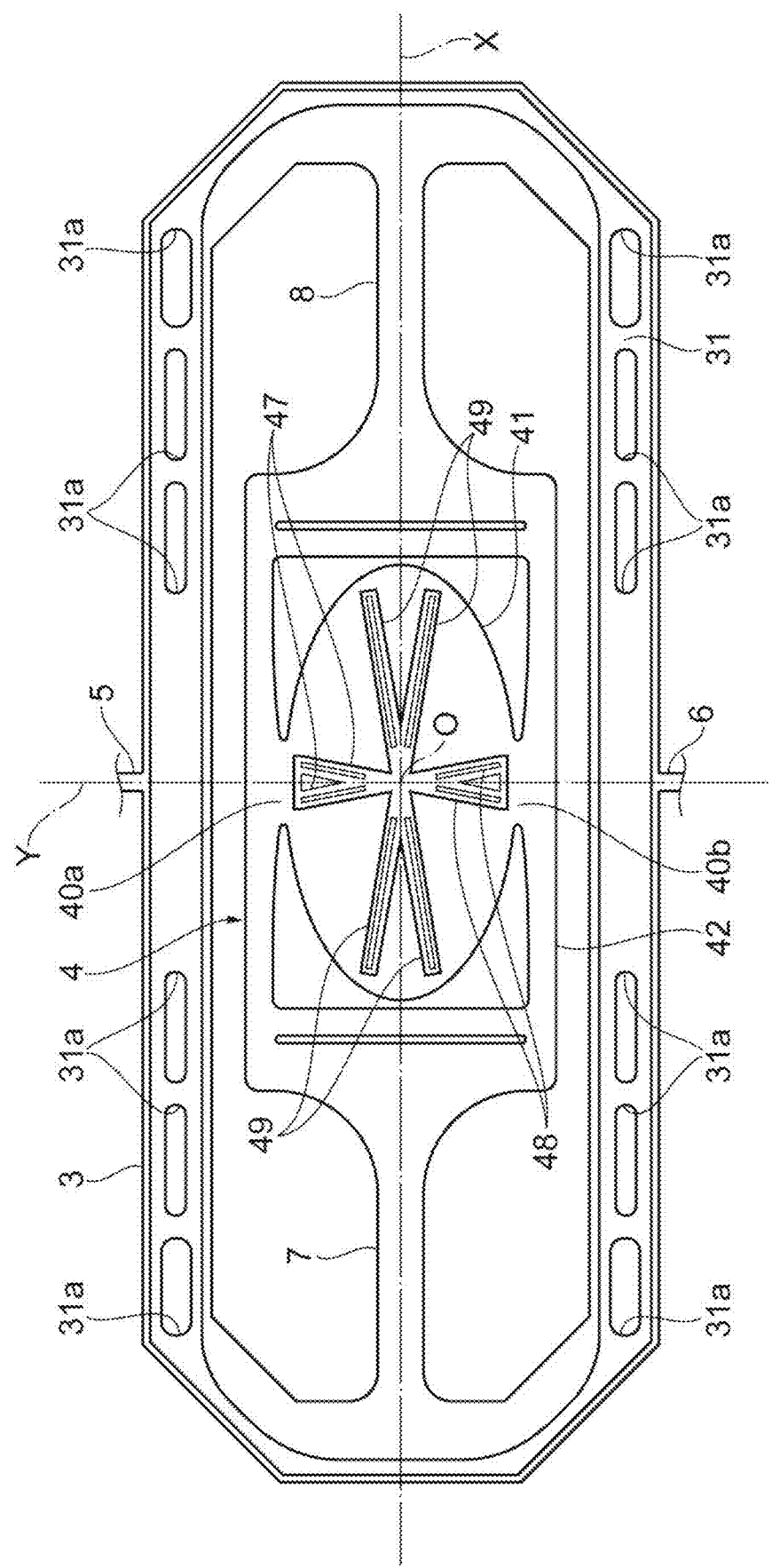
FIG. 4 is a bottom view of a main part of the mirror device illustrated in FIG. 1.

As illustrated in FIG. 4, the back surface of the support portion 3 (the surface on the side of the magnetic field generator 10) is provided with a beam structure 31. The beam structure 31 extends in an annular shape along the frame-shaped support portion 3 when viewed from a direction perpendicular to the X axis and the Y axis. The width (the width in the X-axis direction) of the portion extending in the Y-axis direction in the beam structure 31 is smaller than the width (the width in the Y-axis direction) of the portion extending in the X-axis direction in the beam structure 31. A plurality of punched portions 31a are formed in the portion extending in the X-axis direction in the beam structure 31 except for an intermediate portion crossing the Y axis. The size of each punched portion 31a increases as it goes away from the Y axis.

The center position (the center position of the width in the X-axis direction) of the extension portion in the Y-axis direction on the side of the torsion bar 7 in the beam structure 31 is located on the outside (the side opposite to the torsion bar 7) in relation to the center position (the center position of the width in the X-axis direction) of the portion connected to the torsion bar 7 and extending in the Y-axis direction in the support portion 3. The center position (the center position of the width in the X-axis direction) of the portion extending in the Y-axis direction on the side of the torsion bar 8 in the beam structure 31 is located on the outside (the side opposite to the torsion bar 8) in relation to the center position (the center position of the width in the X-axis direction) of the portion connected to the torsion bar 8 and extending in the Y-axis direction in the support portion 3.

The back surface of the mirror unit 41 (the surface on the side of the magnetic field generator 10) is provided with a plurality of beam structures 47, 48, and 49. A beam structure 47 extends from the intersection O in a V shape toward both edge portions of the connection region 40a in the X-axis direction when viewed from a direction perpendicular to the X axis and the Y axis. A beam structure 48 extends from the intersection O in a V shape toward both edge portions of the connection region 40b in the X-axis direction when viewed from a direction perpendicular to the X axis and the Y axis. A beam structure 49 extends from the intersection O in an X shape toward both edge portions in the X-axis direction when viewed from a direction perpendicular to the X axis and the Y axis.

Operation and Effect

In the mirror device 1, the pair of torsion bars 7 and 8 connected to a frame-shaped frame 42 is disposed on the X axis and the pair of connection regions 40a and 40b in which the mirror unit 41 and the frame-shaped frame 42 are connected to each other is located on both sides of the mirror unit 41 in the Y-axis direction. Accordingly, even when the movable portion 4 is swung at a high speed while using the X axis as a center line, stress occurring in each of the connection regions 40a and 40b due to the twist of the pair of torsion bars 7 and 8 becomes smaller than, for example, a case in which only the pair of connection regions 40a and 40b is located on the X axis or a case in which the mirror unit 41 and the frame-shaped frame 42 are connected to each other only in one connection region 40a (or 40b). Further, in the mirror device 1, the outer edge of the mirror unit 41 and the inner edge of the frame 42 are connected to each other so that the curvature in each of the connection regions 40a and 40b is continuous when viewed from a direction perpendicular to the X axis and the Y axis. Accordingly, stress concentration hardly occurs in each of the connection regions 40a and 40b. As described above, according to the mirror device 1, both the bending of the mirror unit 41 and the damage of the movable portion 4 can be suppressed.

In the mirror device 1, the pair of connection regions 40a and 40b is located on both sides of the minor unit 41 on the Y axis. Accordingly, a sufficient distance between each of the torsion bars 7 and 8 and each of the connection regions 40a and 40b (a distance that the influence of the twist of the pair of torsion bars 7 and 8 hardly reaches each of the connection regions 40a and 40b) can be secured. Thus, both the bending of the mirror unit 41 and the damage of the movable portion 4 can be suppressed while simplifying the configuration of the movable portion 4.

In the mirror device 1, the frame 42 includes the pair of first portions 43 and 44 connected to the minor unit 41 and extending in the X-axis direction and the width of each of the first portions 43 and 44 in the Y-axis direction becomes smaller as it goes away from each of the connection regions 40a and 40b. Accordingly, stress due to the twist of the pair of torsion bars 7 and 8 is dispersed in the portion of which the width is smaller than that of each of the first portions 43 and 44 so that stress occurring in each of the connection regions 40a and 40b can be further decreased. Furthermore, it is possible to decrease the inertia moment of the movable portion 4 when the X axis is a rotation axis as the width of each of the first portions 43 and 44 decreases while securing the connection strength in each of the connection regions 40a and 40b. It is advantageous to decrease the inertia moment of the movable portion 4 while using the X axis a rotation axis when swinging the movable portion 4 at a high speed while using the X axis as a center line. In particular, since the side surface 43a on the inside of the first portion 43 becomes a curved surface curved in a concave shape toward the side opposite to the mirror unit 41 so as to be closer to the side surface 43b on the outside of the first portion 43 as it goes away from the connection region 40a and the side surface 44a on the inside of the first portion 44 becomes a curved surface curved in a concave shape toward the side opposite to the mirror unit 41 so as to be closer to the side surface 44b on the outside of the first portion 44 as it goes away from the connection region 40b, stress due to the twist of the pair of torsion bars 7 and 8 is further dispersed so that the occurrence of stress concentration in each of the first portions 43 and 44 can be suppressed.

Figure 5:
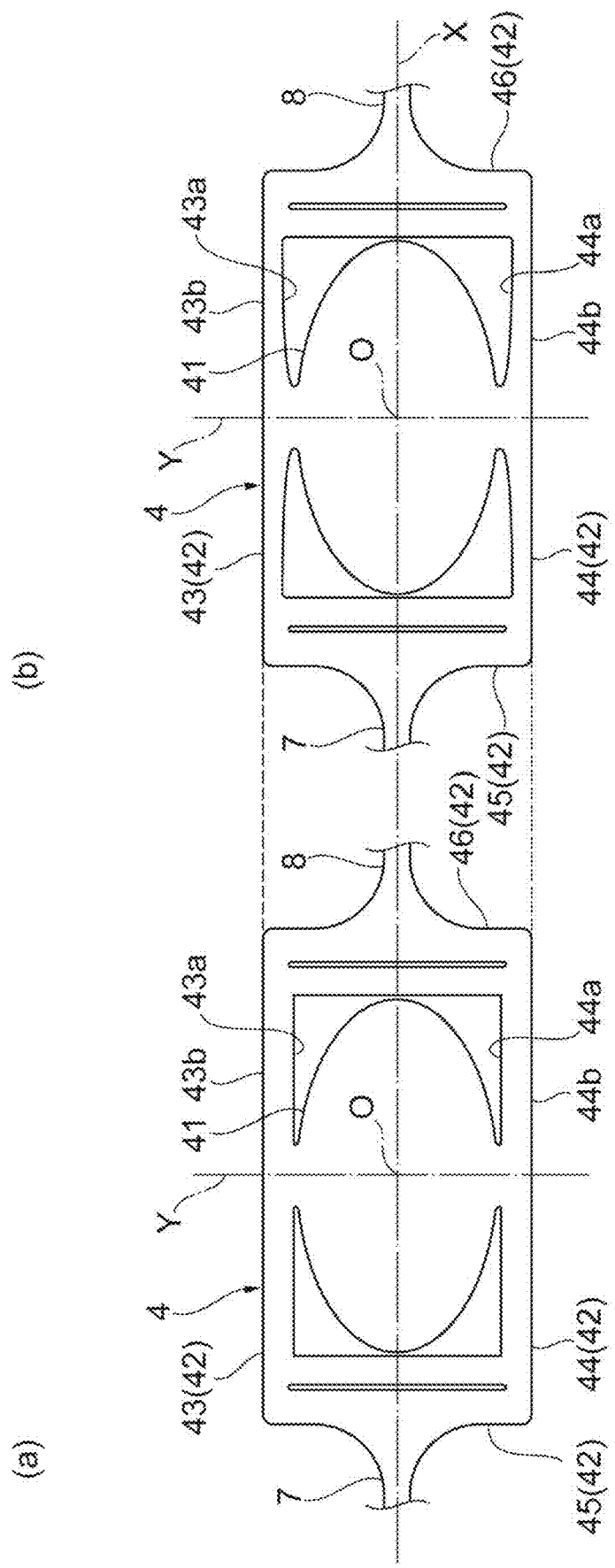
FIG. 5 is (a) a plan view of a movable portion of a comparative example and (b) a plan view of the movable portion of the embodiment.
Figure 6:
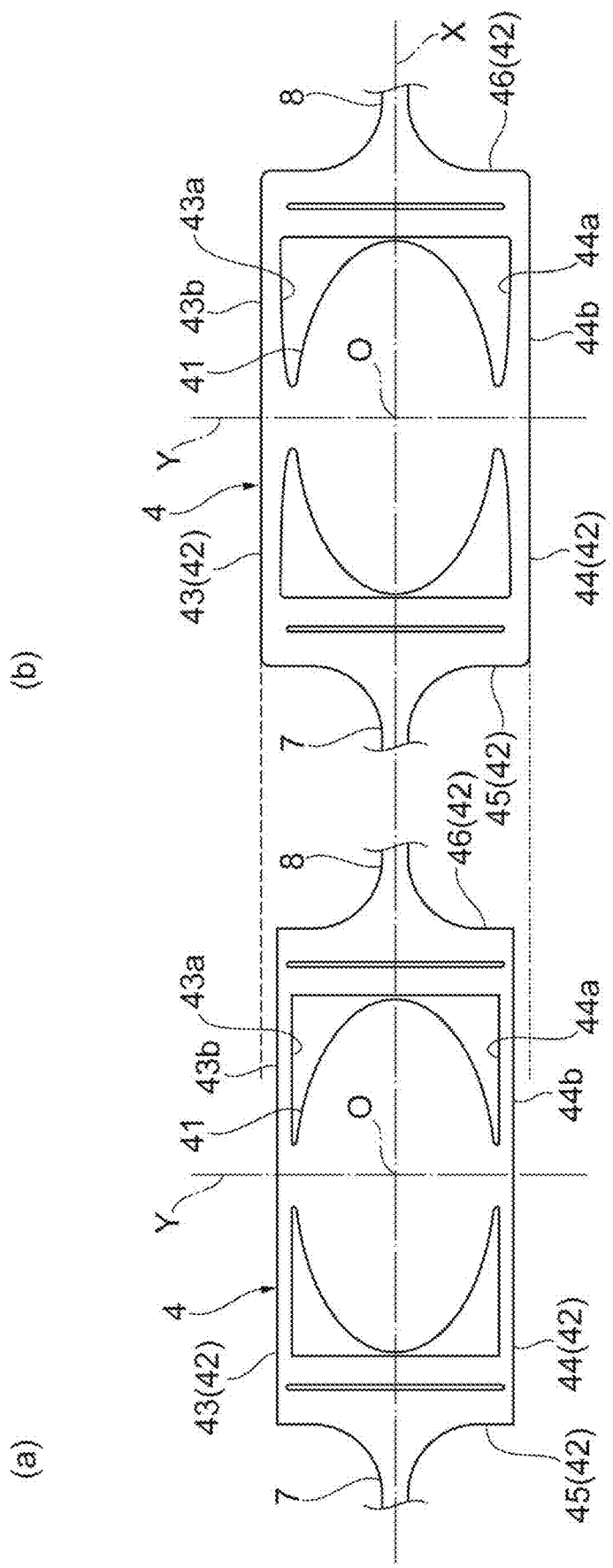
FIG. 6 is (a) a plan view of the movable portion of the comparative example and (b) a plan view of the movable portion of the embodiment.

(a) of FIG. 5 is a plan view of the movable portion 4 of the comparative example and (b) of FIG. 5 is a plan view of the movable portion 4 (the above-described movable portion 4) of the embodiment. (a) of FIG. 6 is a plan view of the movable portion 4 of the comparative example and (b) of FIG. 6 is a plan view of the movable portion 4 of the embodiment. In the movable portion 4 of the comparative example illustrated in (a) of FIG. 5, the width of each of the first portions 43 and 44 in the Y-axis direction is constant and the width of the movable portion 4 in the Y-axis direction is the same as the width of the movable portion 4 of the embodiment illustrated in (b) of FIG. 5. In the movable portion 4 of the comparative example illustrated in (a) of FIG. 6, the width of each of the first portions 43 and 44 in the Y-axis direction is constant and the width of the movable portion 4 in the Y-axis direction is smaller than the width of the movable portion 4 of the embodiment illustrated in (b) of FIG. 6.

When the movable portion 4 of the comparative example illustrated in (a) of FIG. 5 is compared with the movable portion 4 of the comparative example illustrated in (a) of FIG. 6, the inertia moment of the movable portion 4 when the X axis is a rotation axis increases in the movable portion 4 of the comparative example illustrated in (a) of FIG. 5 and stress due to the twist of the pair of torsion bars 7 and 8 cannot be decreased in the movable portion 4 of the comparative example illustrated in (a) of FIG. 6. On the other hand, according to the movable portion 4 of the embodiment illustrated in (b) of FIG. 5 and (b) of FIG. 6, the inertia moment of the movable portion 4 when the X axis is a rotation axis can be smaller than the movable portion 4 of the comparative example illustrated in (a) of FIG. 5. Further, according to the movable portion 4 of the embodiment illustrated in (b) of FIG. 5 and (b) of FIG. 6, stress due to the twist of the pair of torsion bars 7 and 8 can be smaller than the movable portion 4 of the comparative example illustrated in (a) of FIG. 6.

In the mirror device 1, the frame 42 includes the pair of second portions 45 and 46 connected to the pair of torsion bars 7 and 8 and extending in the Y-axis direction in addition to the pair of first portions 43 and 44. Accordingly, stress due to the twist of the pair of torsion bars 7 and 8 is dispersed in the portion between each of the first portions 43 and 44 and each of the second portions 45 and 46 connected to each other so that stress occurring in each of the connection regions 40a and 40b can be further decreased.

In the mirror device 1, the inner edge of each of the first portions 43 and 44 and the inner edge of each of the second portions 45 and 46 are connected to each other so that the curvature in each connection region is continuous when viewed from a direction perpendicular to the X axis and the Y axis. Accordingly, the occurrence of stress concentration can be suppressed in each connection region between the inner edge of each of the first portions 43 and 44 and the inner edge of each of the second portions 45 and 46.

In the mirror device 1, the outer edge of each of the first portions 43 and 44 and the outer edge of each of the second portions 45 and 46 are connected to each other so that the curvature in each connection region is continuous when viewed from a direction perpendicular to the X axis and the Y axis. Accordingly, the occurrence of stress concentration can be suppressed in each connection region between the outer edge of each of the first portions 43 and 44 and the outer edge of each of the second portions 45 and 46.

In the mirror device 1, the length of each of the first portions 43 and 44 in the X-axis direction is longer than the length of each of the second portions 45 and 46 in the Y-axis direction. Accordingly, a sufficient distance between each of the torsion bars 7 and 8 and each of the connection regions 40a and 40b (a distance that the influence of the twist of the pair of torsion bars 7 and 8 hardly reaches each of the connection regions 40a and 40b) can be secured while suppressing an increase in the inertia moment of the movable portion 4 when the X axis is a rotation axis.

In the mirror device 1, each of the distance between the connection region 40a and the second portion 45, the distance between the connection region 40a and the second portion 46, the distance between the connection region 40b and the second portion 45, and the distance between the connection region 40b and the second portion 46 is longer than each of the distance between the X axis and the first portion 43 and the distance between the X axis and the first portion 44. Accordingly, a sufficient distance between each of the torsion bars 7 and 8 and each of the connection regions 40a and 40b (a distance that the influence of the twist of the pair of torsion bars 7 and 8 hardly reaches each of the connection regions 40a and 40b) can be secured while suppressing an increase in the inertia moment of the movable portion 4 when the X axis is a rotation axis.

In the mirror device 1, the shape of the mirror unit 41 when viewed from a direction perpendicular to the X axis and the Y axis is an ellipse having a major axis along the X axis. Accordingly, a sufficient area of the mirror surface 41a can be secured while suppressing an increase in the inertia moment of the movable portion 4 when the X axis is a rotation axis.

In the mirror device 1, the width of each of the connection regions 40a and 40b in the X-axis direction is 30% or less of the width of the mirror unit 41 in the X-axis direction. Accordingly, it is possible to secure a sufficient connection strength between the mirror unit 41 and the frame 42 and a sufficient distance between each of the torsion bars 7 and 8 and each of the connection regions 40a and 40b at the same time.

In the minor device 1, the coil 11 extends along each of the side surfaces 43b and 44b on the outside of each of the first portions 43 and 44 and extends along each of the side surfaces 45a and 46a on the inside of each of the second portions 45 and 46. Accordingly, since the coil 11 is separated from each of the connection regions 40a and 40b and each of the torsion bars 7 and 8, stress occurring in the coil 11 due to the twist of the pair of torsion bars 7 and 8 decreases. Thus, the occurrence of the metal fatigue in the coil 11 can be suppressed. As described above, stress is reduced in each of the connection regions 40a and 40b to a degree that the bending of the mirror unit 41 and the damage of the movable portion 4 are not caused, but there is concern that stress causing the metal fatigue of the coil 11 may remain. For that reason, it is effective from the viewpoint of safety to separate the coil 11 from each of the connection regions 40a and 40b by extending the coil 11 along each of the side surfaces 43b and 44b in each of the first portions 43 and 44.

In the mirror device 1, the slit 45c located between the torsion bar 7 and the mirror unit 41 is formed in the first portion 43 and the slit 46c located between the torsion bar 8 and the mirror unit 41 is formed in the first portion 44. Accordingly, the influence of the twist of the pair of torsion bars 7 and 8 hardly reaches the coil 11. Thus, the occurrence of the metal fatigue in the coil 11 can be suppressed. Furthermore, the influence of the twist of the pair of torsion bars 7 and 8 hardly reaches each of the connection regions

40*a* and 40*b*. Thus, it is possible to more reliably suppress both the bending of the mirror unit 41 and the damage of the movable portion 4.

In the mirror device 1, the coil 9 extends along the side surface 3*b* on the outside of the support portion 3. Accordingly, since the coil 9 is separated from each of the torsion bars 7 and 8, stress occurring in the coil 9 due to the twist of the pair of torsion bars 7 and 8 decreases. Thus, the occurrence of the metal fatigue in the coil 9 can be suppressed.

In the mirror device 1, the curvature of the outer edge of the torsion bar 7 in a region connected to the outer edge of the second portion 45 is smaller than the curvature of the outer edge of the torsion bar 7 in a region connected to the inner edge of the support portion 3. Similarly, the curvature of the outer edge of the torsion bar 8 in a region connected to the outer edge of the second portion 46 is smaller than the curvature of the outer edge of the torsion bar 8 in a region connected to the inner edge of the support portion 3. When the curvature of the outer edge of each of the torsion bars 7 and 8 in a region connected to the frame 42 is decreased, stress occurring in the frame 42 due to the twist of the pair of torsion bars 7 and 8 can be decreased. Meanwhile, when the curvature of the outer edge of each of the torsion bars 7 and 8 in a region connected to the support portion 3 is increased, the length of each of the torsion bars 7 and 8 can be secured and stress due to the twist of the pair of torsion bars 7 and 8 can be decreased. Additionally, it is effective to decrease stress due to the twist of the pair of torsion bars 7 and 8 on the side of the movable portion 4 operated linearly in relation to the side of the support portion 3.

In the mirror device 1, the back surface of the support portion 3 is provided with the beam structure 31 extending in an annular shape along the frame-shaped support portion 3. Accordingly, the deformation of the support portion 3 can be suppressed. Further, since the beam structure 31 is formed continuously, the occurrence of stress concentration can be suppressed as compared with a case in which the beam structure 31 is formed intermittently. Further, in the mirror device 1, the width (the width in the X-axis direction) of the portion extending in the Y-axis direction in the beam structure 31 is smaller than the width (the width in the Y-axis direction) of the portion extending in the X-axis direction in the beam structure 31. Accordingly, it is possible to decrease the inertia moment of the support portion 3 when the Y axis is a rotation axis. Further, in the mirror device 1, the size of each of the punched portions 31*a* formed in the portion extending in the X-axis direction in the beam structure 31 becomes larger as it goes away from the Y axis. Accordingly, it is possible to decrease the inertia moment of the support portion 3 when the Y axis is a rotation axis. Further, in the mirror device 1, the punched portion 31*a* is not formed in the intermediate portion crossing the Y axis in the beam structure 31. Accordingly, it is possible to suppress the support portion 3 from swinging around the X axis as a center line by increasing the inertia moment of the support portion 3 when the X axis is a rotation axis. Furthermore, in the mirror device 1, the center position of the portion extending in the Y-axis direction in the beam structure 31 is located on the outside of the center position of the portion extending in the Y-axis direction in the support portion 3. Accordingly, since the portion extending in the Y-axis direction on the side of the torsion bar 7 in the beam structure 31 is separated from the torsion bar 7 and the portion extending in the Y-axis direction on the side of the torsion bar 8 in the beam structure 31 is separated from the torsion bar 8, stress occurring in the beam structure 31 due to the twist of the pair of torsion bars 7 and 8 can be decreased.

In the mirror device 1, the back surface of the mirror unit 41 is provided with the beam structure 47 extending from the intersection O in a V shape toward both edge portions of the connection region 40*a* in the X-axis direction and the beam structure 48 extending from the intersection O in a V shape toward both edge portions of the connection region 40*b* in the X-axis direction. Accordingly, stress occurring in each of the connection regions 40*a* and 40*b* due to the twist of the pair of torsion bars 7 and 8 can be decreased.

Modified Example

The present disclosure is not limited to the above-described embodiment. For example, the material and shape of each component are not limited to the materials and shapes described above and various materials and shapes can be employed. As an example, the frame 42 may have, for example, an outer shape of a polygonal shape other than a square shape when viewed from a direction perpendicular to the X axis and the Y axis if the frame is formed in a frame shape. Further, the mirror surface 41*a* may be formed in at least a part of the mirror unit 41. Further, the shape of the mirror unit 41 when viewed from a direction perpendicular to the X axis and the Y axis may be a circular shape or the like. Further, the driving method of the mirror device 1 is not limited to the electromagnetic driving type and may be an electrostatic driving type, a piezoelectric driving type, a thermal driving type, or the like. Further, the base 2 and the pair of torsion bars 5 and 6 may not be provided in the mirror device 1 and the support portion 3 may function as the base.

Further, when the pair of torsion bars 7 and 8 is disposed on both sides of the movable portion 4 on the first axis, the pair of connection regions 40*a* and 40*b* may be located on both sides of the mirror unit 41 in a direction parallel to the second axis perpendicular to the first axis. As an example, when a pair of portions (portions forming opposite sides) of the polygonal frame-shaped frame 42 intersects the second axis, the pair of connection regions 40*a* and 40*b* may be disposed inside the pair of portions. In the above-described embodiment, the pair of connection regions 40*a* and 40*b* may be disposed inside the pair of first portions 43 and 44. Alternatively, the pair of connection regions 40*a* and 40*b* may be disposed in a region of 45° or more and 135° or less in one direction from the first axis and a region of 45° or more and 135° or less in the other direction from the first axis with the intersection between the first axis and the second axis as a center point regardless of the shape of the frame 42. Additionally, each of the connection regions 40*a* and 40*b* may be a plurality of physically divided regions.

Further, when the width of the first portion 43 in the Y-axis direction becomes smaller as it goes away from the connection region 40*a*, as illustrated in (a) of FIG. 7, the side surface 43*a* on the inside of the first portion 43 may be a flat surface inclined so as to be closer to the side surface 43*b* on the outside of the first portion 43 as it goes away from the connection region 40*a*. Similarly, when the width of the first portion 44 in the Y-axis direction becomes smaller as it goes away from the connection region 40*b*, as illustrated in (a) of FIG. 7, the side surface 44*a* on the inside of the first portion 44 may be a flat surface inclined so as to be closer to the side surface 44*b* on the outside of the first portion 44 as it goes away from the connection region 40*b*.

Further, when the width of the first portion 43 in the Y-axis direction becomes smaller as it goes away from the connection region 40*a*, as illustrated in (b) of FIG. 7, the side surface 43a on the inside of the first portion 43 may be a bent surface bent stepwise so as to be closer to the side surface 43b on the outside of the first portion 43 as it goes away from the connection region 40a. Similarly, when the width of the first portion 44 in the Y-axis direction becomes smaller as it goes away from the connection region 40b, as illustrated in (b) of FIG. 7, the side surface 44a on the inside of the first portion 44 may be a bent surface bent stepwise so as to be closer to the side surface 44b on the outside of the first portion 44 as it goes away from the connection region 40b.

Figure 8:
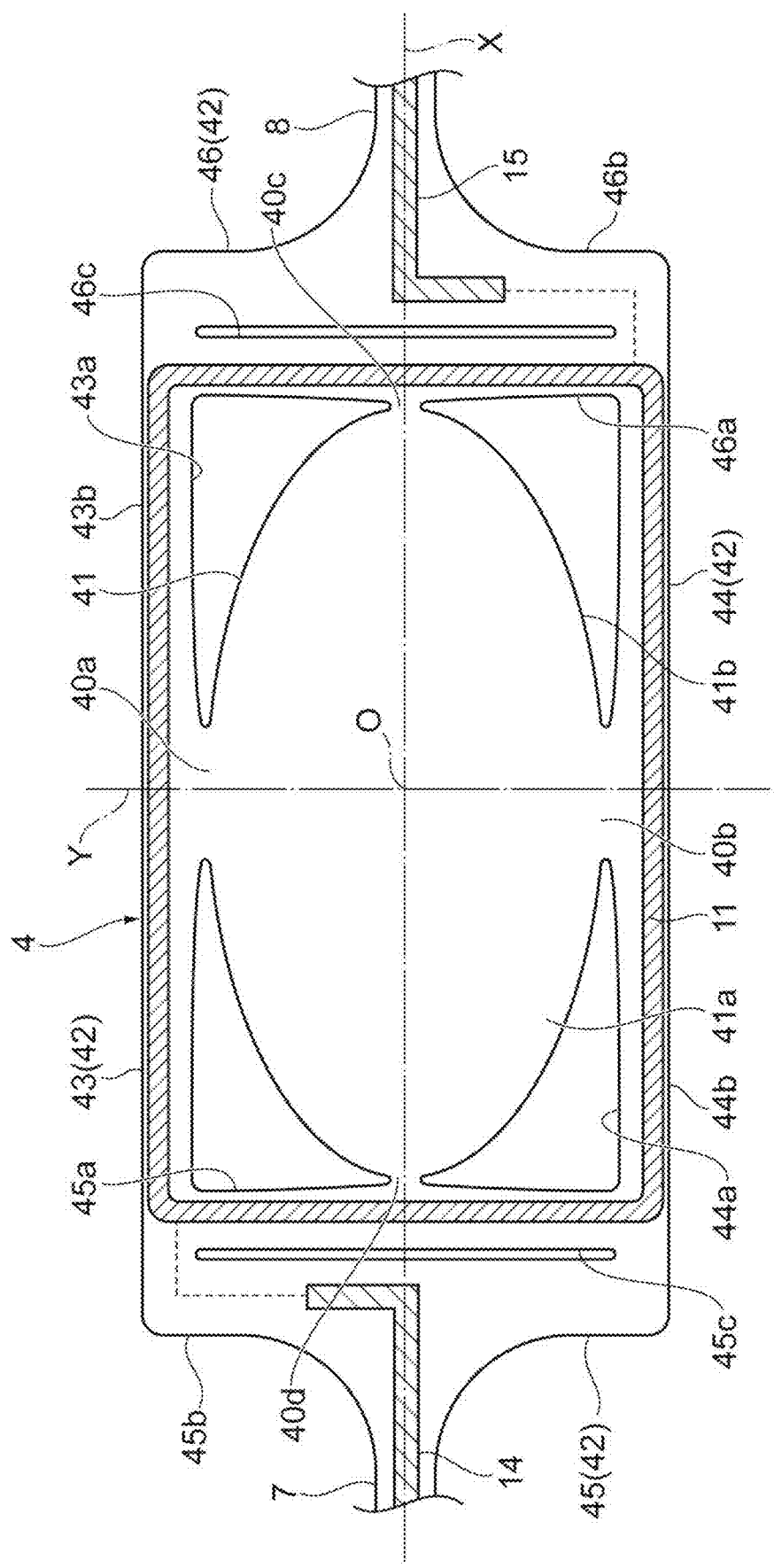
FIG. 8 is a plan view of a movable portion of a third modified example.

Further, in the movable portion 4 of the third modified example, as illustrated in FIG. 8, the mirror unit 41 is connected to the frame 42 in each of the pair of connection regions (first connection regions) 40a and 40b located on both sides of the mirror unit 41 in the Y-axis direction and each of the pair of connection regions (second connection regions) 40c and 40d located on both sides of the mirror unit 41 in the X-axis direction. In the region between the mirror unit 41 and the frame 42, a region other than the pair of connection regions 40a and 40b and the pair of connection regions 40c and 40d is a space. That is, the mirror unit 41 and the frame 42 are connected to each other only in the pair of connection regions 40a and 40b and the pair of connection regions 40c and 40d.

The side surface 41b of the mirror unit 41 and the side surface 43a on the inside of the first portion 43 are connected to each other so that the curvature in the connection region 40a is continuous. The side surface 41b of the mirror unit 41 and the side surface 44a on the inside of the first portion 44 are connected to each other so that the curvature in the connection region 40b is continuous. That is, the outer edge of the mirror unit 41 and the inner edge of the frame 42 are connected to each other so that the curvature in each of the connection regions 40a and 40b is continuous when viewed from a direction perpendicular to the X axis and the Y axis.

The side surface 41b of the mirror unit 41 and the side surface 45a on the inside of the second portion 45 are connected to each other so that the curvature in the connection region 40d is continuous. The side surface 41b of the mirror unit 41 and the side surface 46a on the inside of the second portion 46 are connected to each other so that the curvature in the connection region 40c is continuous. That is, the outer edge of the minor unit 41 and the inner edge of the frame 42 are connected to each other so that the curvature in each of the connection regions 40c and 40d is continuous when viewed from a direction perpendicular to the X axis and the Y axis.

The width of the first portion 43 in the Y-axis direction becomes smaller as it goes away from the connection region 40a. Here, the side surface 43b on the outside of the first portion 43 becomes a flat surface parallel to the X axis and the side surface 43a on the inside of the first portion 43 becomes a surface closer to the side surface 43b as it goes away from the connection region 40a. The width of the first portion 44 in the Y-axis direction becomes smaller as it goes away from the connection region 40b. Here, the side surface 44b on the outside of the first portion 44 becomes a flat surface parallel to the X axis and the side surface 44a on the inside of the first portion 44 becomes a surface closer to the side surface 44b as it goes away from the connection region 40b.

In addition, the side surface 43a on the inside of the first portion 43 may be a flat surface inclined so as to be closer to the side surface 43b on the outside of the first portion 43 as it goes away from the connection region 40a. Similarly, the side surface 44a on the inside of the first portion 44 may be a flat surface inclined so as to be closer to the side surface 44b on the outside of the first portion 44 as it goes away from the connection region 40b. Further, the side surface 43a on the inside of the first portion 43 may be a bent surface bent stepwise so as to be closer to the side surface 43b on the outside of the first portion 43 as it goes away from the connection region 40a. Similarly, the side surface 44a on the inside of the first portion 44 may be a bent surface bent stepwise so as to be closer to the side surface 44b on the outside of the first portion 44 as it goes away from the connection region 40b.

The width of the second portion 45 in the X-axis direction becomes smaller as it goes away from the connection region 40d. Here, the side surface 45b on the outside of the second portion 45 becomes a flat surface parallel to the Y axis and the side surface 45a on the inside of the second portion 45 becomes a surface closer to the side surface 45b as it goes away from the connection region 40d. The width of the second portion 46 in the X-axis direction becomes smaller as it goes away from the connection region 40c. Here, the side surface 46b on the outside of the second portion 46 becomes a flat surface parallel to the Y axis and the side surface 46a on the inside of the second portion 46 becomes a surface closer to the side surface 46b as it goes away from the connection region 40c.

In addition, the side surface 45a on the inside of the second portion 45 may be a flat surface inclined so as to be closer to the side surface 45b on the outside of the second portion 45 as it goes away from the connection region 40d. Similarly, the side surface 46a on the inside of the second portion 46 may be a flat surface inclined so as to be closer to the side surface 46b on the outside of the second portion 46 as it goes away from the connection region 40c. Further, the side surface 45a on the inside of the second portion 45 may be a bent surface bent stepwise so as to be closer to the side surface 45b on the outside of the second portion 45 as it goes away from the connection region 40d. Similarly, the side surface 46a on the inside of the second portion 46 may be a bent surface bent stepwise so as to be closer to the side surface 46b on the outside of the second portion 46 as it goes away from the connection region 40c.

In the mirror device 1 including the movable portion 4 of the third modified example, the pair of torsion bars 7 and 8 connected to the frame-shaped frame 42 is disposed on the X axis and the pair of connection regions 40a and 40b in which the mirror unit 41 and the frame-shaped frame 42 are connected to each other is located on both sides of the mirror unit 41 in the Y-axis direction. Furthermore, the pair of connection regions 40c and 40d in which the mirror unit 41 and the frame-shaped frame 42 are connected to each other is located on both sides of the mirror unit 41 in the X-axis direction. Accordingly, even when the movable portion 4 is swung at a high speed while using the X axis as a center line, stress occurring in each of the connection regions 40a, 40b, 40c, and 40d due to the twist of the pair of torsion bars 7 and 8 becomes smaller than, for example, a case in which only the pair of connection regions 40a and 40b is located on the X axis or a case in which the mirror unit 41 and the frame-shaped frame 42 are connected to each other only in one connection region 40a (or 40b). Further, in the mirror device 1 including the movable portion 4 of the third modified example, the outer edge of the mirror unit 41 and the inner edge of the frame 42 are connected to each other so that the curvature in each of the connection regions 40a and 40b is continuous when viewed from a direction perpendicular to the X axis and the Y axis. Accordingly, stress concentration hardly occurs in each of the connection regions 40a and 40b. As described above, according to the mirror device 1 including the movable portion 4 of the third modified example, both the bending of the mirror unit 41 and the damage of the movable portion 4 can be suppressed.

In the mirror device 1 including the movable portion 4 of the third modified example, the outer edge of the mirror unit 41 and the inner edge of the frame 42 are connected to each other so that the curvature in each of the connection regions 40c and 40d is continuous when viewed from a direction perpendicular to the X axis and the Y axis. Accordingly, stress concentration hardly occurs in each of the connection regions 40c and 40d.

In the mirror device 1 including the movable portion 4 of the third modified example, the pair of connection regions 40c and 40d is located on both sides of the mirror unit 41 on the X axis. Accordingly, the inertia moment of the movable portion around the X axis can be decreased.

When the pair of torsion bars 7 and 8 is disposed on both sides of the movable portion 4 on the first axis, the pair of connection regions 40c and 40d may be located on both sides of the mirror unit 41 in a direction parallel to the first axis. As an example, when a pair of portions (portions forming opposite sides) of the polygonal frame-shaped frame 42 intersects the first axis, the pair of connection regions 40c and 40d may be disposed inside the pair of portions. In the movable portion 4 of the third modified example, the pair of connection regions 40c and 40d may be disposed inside the pair of second portions 45 and 46. Alternatively, the pair of connection regions 40c and 40d may be disposed in a region of 45° or more and 135° or less in one direction from the second axis and a region of 45° or more and 135° or less in the other direction from the second axis with the intersection between the first axis and the second axis as a center point regardless of the shape of the frame 42. Additionally, each of the connection regions 40c and 40d may be a plurality of physically divided regions.

In the mirror device 1 including the movable portion 4 of the third modified example, the width of each of the first portions 43 and 44 in the Y-axis direction becomes smaller as it goes away from each of the connection regions 40a and 40b and the width of each of the second portions 45 and 46 in the X-axis direction becomes smaller as it goes away from each of the connection regions 40c and 40d. Accordingly, stress due to the twist of the pair of torsion bars 7 and 8 is dispersed in the portion of which the width is smaller than that of each of the first portions 43 and 44 and each of the second portions 45 and 46 so that stress occurring in each of the connection regions 40a, 40b, 40c, and 40d can be further decreased. Furthermore, it is possible to decrease the inertia moment of the movable portion 4 when the X axis is a rotation axis as the width of each of the first portions 43 and 44 and each of the second portions 45 and 46 decreases while securing the connection strength in each of the connection regions 40a, 40b, 40c, and 40d. Here, the width of each of the second portions 45 and 46 in the X-axis direction may not decrease as it goes away from each of the connection regions 40c and 40d.

In the mirror device 1 including the movable portion 4 of the third modified example, the slit 45c located between the torsion bar 7 and the mirror unit 41 is formed in the first portion 43 and the slit 46c located between the torsion bar 8 and the mirror unit 41 is formed in the first portion 44. Furthermore, the curvature of the outer edge of the torsion bar 7 in a region connected to the outer edge of the second portion 45 is smaller than the curvature of the outer edge of the torsion bar 7 in a region connected to the inner edge of the support portion 3. Similarly, the curvature of the outer edge of the torsion bar 8 in a region connected to the outer edge of the second portion 46 is smaller than the curvature of the outer edge of the torsion bar 8 in a region connected to the inner edge of the support portion 3. Accordingly, in the mirror device 1 including the movable portion 4 of the third modified example, the influence of the twist of the pair of torsion bars 7 and 8 hardly reaches the pair of connection regions 40c and 40d while realizing a stable support of the mirror unit 41 by four connection regions 40a, 40b, 40c, and 40d.

Each of the configurations of the above-described embodiments is also applied to the mirror device 1 including the movable portion 4 of the third modified example. For example, the inner edge of each of the first portions 43 and 44 and the inner edge of each of the second portions 45 and 46 are connected to each other so that the curvature in each connection region is continuous when viewed from a direction perpendicular to the X axis and the Y axis. Further, the outer edge of each the first portions 43 and 44 and the outer edge of each of the second portions 45 and 46 are connected to each other so that the curvature in each connection region is continuous when viewed from a direction perpendicular to the X axis and the Y axis. Further, the length of each of the first portions 43 and 44 in the X-axis direction is longer than the length of each of the second portions 45 and 46 in the Y-axis direction. Further, each of the distance between the connection region 40a and the second portion 45, the distance between the connection region 40a and the second portion 46, the distance between the connection region 40b and the second portion 45, and the distance between the connection region 40b and the second portion 46 is longer than each of the distance between the X axis and the first portion 43 and the distance between the X axis and the first portion 44. Further, the shape of the mirror unit 41 when viewed from a direction perpendicular to the X axis and the Y axis is an ellipse having a major axis along the X axis. Further, the width of each of the connection regions 40a and 40b in the X-axis direction is 30% or less of the width of the mirror unit 41 in the X-axis direction. Further, the coil 11 extends along each of the side surfaces 43b and 44b on the outside of each of the first portions 43 and 44 and extends along each of the side surfaces 45a and 46a on the inside of each of the second portions 45 and 46. Further, the coil 9 extends along the side surface 3b on the outside of the support portion 3. Further, the back surface of the support portion 3 is provided with the beam structure 31 extending in an annular shape along the frame-shaped support portion 3. Further, the back surface of the mirror unit 41 is provided with the beam structure 47 extending from the intersection O in a V shape toward both edge portions of the connection region 40a in the X-axis direction and the beam structure 48 extending from the intersection O in a V shape toward both edge portions of the connection region 40b in the X-axis direction.

Also in the mirror device 1 including the movable portion 4 of the third modified example, the material and shape of each component are not limited to the materials and shapes described above and various materials and shapes can be adopted. As an example, the frame 42 may have, for example, an outer shape such as a polygonal shape other than a square shape when viewed from a direction perpendicular to the X axis and the Y axis if the frame is formed in a frame shape. Further, the mirror surface 41a may be formed in at least a part of the mirror unit 41. Further, the shape of the mirror unit 41 when viewed from a direction perpendicular to the X axis and the Y axis may be a circular shape or the like.

In the embodiments and modified examples described above, the coil 11 for swinging the movable portion 4 is provided in the movable portion 4 and the coil 9 for swinging the support portion 3 is provided in the support portion 3. However, each of the coil for swinging the movable portion 4 and the coil for swinging the support portion 3 may be provided in the support portion 3 or a single coil for swinging the movable portion 4 and the support portion 3 may be provided in the support portion 3.

Each configuration in one embodiment or modified example described above can be arbitrarily applied to each configuration in another embodiment or modified example.

REFERENCE SIGNS LIST

1: mirror device, 3: support portion, 4: movable portion, 7, 8: torsion bar, 40a, 40b: connection region (first connection region), 40c, 40d: connection region (second connection region), 41: mirror unit, 42: frame, 43, 44: first portion, 45, 46: second portion.

The invention claimed is:

1. A mirror device comprising:
a support portion;
a movable portion; and
a pair of torsion bars disposed on both sides of the movable portion on a first axis and connecting the movable portion to the support portion so that the movable portion is swingable around the first axis as a center line,
wherein the movable portion includes a frame-shaped frame connected to the pair of torsion bars and a mirror unit disposed inside the frame,
wherein the mirror unit is connected to the frame in each of a pair of first connection regions located on both sides of the mirror unit in a direction parallel to a second axis perpendicular to the first axis, each of the pair of first connection regions being a region in which twist as occurs in the pair of torsion bars does not occur,
wherein a region other than the pair of first connection regions in a region between the mirror unit and the frame is a space, and
wherein an outer edge of the mirror unit and an inner edge of the frame are connected to each other so that a curvature in each of the pair of first connection regions is continuous when viewed from a direction perpendicular to the first axis and the second axis.

2. A mirror device comprising:
a support portion;
a movable portion; and
a pair of torsion bars disposed on both sides of the movable portion on a first axis and connecting the movable portion to the support portion so that the movable portion is swingable around the first axis as a center line,
wherein the movable portion includes a frame-shaped frame connected to the pair of torsion bars and a mirror unit disposed inside the frame,
wherein the mirror unit is connected to the frame in each of a pair of first connection regions located on both sides of the mirror unit in a direction parallel to a second axis perpendicular to the first axis and each of a pair of second connection regions located on both sides of the mirror unit in a direction parallel to the first axis,
wherein a region other than the pair of first connection regions and the pair of second connection regions in a region between the mirror unit and the frame is a space, and
wherein an outer edge of the mirror unit and an inner edge of the frame are connected to each other so that a curvature in each of the pair of first connection regions is continuous when viewed from a direction perpendicular to the first axis and the second axis.

3. The mirror device according to claim 2,
wherein the outer edge of the mirror unit and the inner edge of the frame are connected to each other so that a curvature in each of the pair of second connection regions is continuous when viewed from a direction perpendicular to the first axis and the second axis.

4. The mirror device according to claim 2,
wherein the pair of second connection regions is located on both sides of the mirror unit on the first axis.

5. The mirror device according to claim 1,
wherein the pair of first connection regions is located on both sides of the mirror unit on the second axis.

6. A mirror device comprising:
a support portion;
a movable portion; and
a pair of torsion bars disposed on both sides of the movable portion on a first axis and connecting the movable portion to the support portion so that the movable portion is swingable around the first axis as a center line,
wherein the movable portion includes a frame-shaped frame connected to the pair of torsion bars and a mirror unit disposed inside the frame,
wherein the mirror unit is connected to the frame in each of a pair of first connection regions located on both sides of the mirror unit in a direction parallel to a second axis perpendicular to the first axis,
wherein a region other than the pair of first connection regions in a region between the mirror unit and the frame is a space,
wherein an outer edge of the mirror unit and an inner edge of the frame are connected to each other so that a curvature in each of the pair of first connection regions is continuous when viewed from a direction perpendicular to the first axis and the second axis,
wherein the frame includes a pair of first portions connected to the mirror unit and extending in a direction parallel to the first axis, and
wherein a width of each of the pair of first portions in a direction parallel to the second axis becomes smaller as it goes away from each of the pair of first connection regions.

7. The mirror device according to claim 6,
wherein the frame further includes a pair of second portions connected to the pair of torsion bars and extending in a direction parallel to the second axis.

8. The mirror device according to claim 7,
wherein an inner edge of each of the pair of first portions and an inner edge of each of the pair of second portions are connected to each other so that a curvature in each of a plurality of connection regions is continuous when viewed from a direction perpendicular to the first axis and the second axis.

9. The mirror device according to claim 7,
wherein an outer edge of each of the pair of first portions and an outer edge of each of the pair of second portions are connected to each other so that a curvature in each of a plurality of connection regions is continuous when viewed from a direction perpendicular to the first axis and the second axis.

10. The mirror device according to claim 7, wherein a length of each of the pair of first portions in a direction parallel to the first axis is longer than a length of each of the pair of second portions in a direction parallel to the second axis.

11. The mirror device according to claim 7, wherein a distance between each of the pair of first connection regions and one of the pair of second portions and a distance between each of the pair of first connection regions and the other of the pair of second portions are longer than a distance between the first axis and each of the pair of first portions.

12. The mirror device according to claim 7, wherein a shape of the mirror unit when viewed from a direction perpendicular to the first axis and the second axis is an ellipse having a major axis along the first axis.

13. The mirror device according to claim 1, wherein a width of each of the pair of first connection regions in a direction parallel to the first axis is 30% or less of a width of the mirror unit in a direction parallel to the first axis.

14. The mirror device according to claim 2, wherein the pair of first connection regions is located on both sides of the mirror unit on the second axis.

15. A mirror device comprising:
a support portion;
a movable portion; and
a pair of torsion bars disposed on both sides of the movable portion on a first axis and connecting the movable portion to the support portion so that the movable portion is swingable around the first axis as a center line,
wherein the movable portion includes a frame-shaped frame connected to the pair of torsion bars and a mirror unit disposed inside the frame,
wherein the mirror unit is connected to the frame in each of a pair of first connection regions located on both sides of the mirror unit in a direction parallel to a second axis perpendicular to the first axis and each of a pair of second connection regions located on both sides of the mirror unit in a direction parallel to the first axis,
wherein a region other than the pair of first connection regions and the pair of second connection regions in a region between the mirror unit and the frame is a space,
wherein an outer edge of the mirror unit and an inner edge of the frame are connected to each other so that a curvature in each of the pair of first connection regions is continuous when viewed from a direction perpendicular to the first axis and the second axis,
wherein the frame includes a pair of first portions connected to the mirror unit and extending in a direction parallel to the first axis, and
wherein a width of each of the pair of first portions in a direction parallel to the second axis becomes smaller as it goes away from each of the pair of first connection regions.

16. The mirror device according to claim 15, wherein the frame further includes a pair of second portions connected to the pair of torsion bars and extending in a direction parallel to the second axis.

17. The mirror device according to claim 16, wherein an inner edge of each of the pair of first portions and an inner edge of each of the pair of second portions are connected to each other so that a curvature in each of a plurality of connection regions is continuous when viewed from a direction perpendicular to the first axis and the second axis.

18. The mirror device according to claim 16, wherein an outer edge of each of the pair of first portions and an outer edge of each of the pair of second portions are connected to each other so that a curvature in each of a plurality of connection regions is continuous when viewed from a direction perpendicular to the first axis and the second axis.

19. The mirror device according to claim 16, wherein a length of each of the pair of first portions in a direction parallel to the first axis is longer than a length of each of the pair of second portions in a direction parallel to the second axis.

20. The mirror device according to claim 16, wherein a distance between each of the pair of first connection regions and one of the pair of second portions and a distance between each of the pair of first connection regions and the other of the pair of second portions are longer than a distance between the first axis and each of the pair of first portions.

21. The mirror device according to claim 16, wherein a shape of the mirror unit when viewed from a direction perpendicular to the first axis and the second axis is an ellipse having a major axis along the first axis.

22. The mirror device according to any one of claim 2, wherein a width of each of the pair of first connection regions in a direction parallel to the first axis is 30% or less of a width of the mirror unit in a direction parallel to the first axis.

23. The mirror device according to claim 1, further comprising:
a base; and
a pair of other torsion bars disposed on both sides of the support portion on the second axis and connecting the support portion to the base so that the support portion is swingable around the second axis as a center line.

24. The mirror device according to claim 2, further comprising:
a base; and
a pair of other torsion bars disposed on both sides of the support portion on the second axis and connecting the support portion to the base so that the support portion is swingable around the second axis as a center line.

25. The mirror device according to claim 23, wherein the support portion has an outer shape elongated in a direction parallel to the first axis when viewed from a direction perpendicular to the first axis and the second axis, and is formed in a frame shape.

26. The mirror device according to claim 24, wherein the support portion has an outer shape elongated in a direction parallel to the first axis when viewed from a direction perpendicular to the first axis and the second axis, and is formed in a frame shape.

27. The mirror device according to claim 23, wherein each of the pair of torsion bars in a linear shape and each of the pair of other torsion bars extends in a meandering shape when viewed from a direction perpendicular to the first axis and the second axis.

28. The mirror device according to claim 24, wherein each of the pair of torsion bars in a linear shape and each of the pair of other torsion bars extends in a meandering shape when viewed from a direction perpendicular to the first axis and the second axis.

29. The mirror device according to claim 1, further comprising:
a magnetic field generator; and
a coil provided to the movable portion.

30. The mirror device according to claim 2, further comprising:
a magnetic field generator; and
a coil provided to the movable portion.

31. The mirror device according to claim 29, wherein the coil extends in a spiral shape while being embedded in the movable portion.

32. The mirror device according to claim 30, wherein the coil extends in a spiral shape while being embedded in the movable portion.

33. The mirror device according to claim 29, further comprising:
a base;
a pair of other torsion bars disposed on both sides of the support portion on the second axis and connecting the support portion to the base so that the support portion is swingable around the second axis as a center line;
an electrode pad provided to the base; and
a wire electrically connecting one end of the coil to the electrode pad;
wherein a portion of the wire passing through each of the pair of torsion bars is formed of a metal material having Vickers hardness larger than that of at least one of a part of the wire provided to the base and the coil.

34. The mirror device according to claim 30, further comprising:
a base;
a pair of other torsion bars disposed on both sides of the support portion on the second axis and connecting the support portion to the base so that the support portion is swingable around the second axis as a center line;
an electrode pad provided to the base; and
a wire electrically connecting one end of the coil to the electrode pad;
wherein a portion of the wire passing through each of the pair of torsion bars is formed of a metal material having Vickers hardness larger than that of at least one of a part of the wire provided to the base and the coil.

35. The mirror device according to claim 1, wherein an outer edge of the pair of torsion bars and an inner edge of the support portion are connected to each other so that a curvature is continuous when viewed from a direction perpendicular to the first axis and the second axis.

36. The mirror device according to claim 2, wherein an outer edge of the pair of torsion bars and an inner edge of the support portion are connected to each other so that a curvature is continuous when viewed from a direction perpendicular to the first axis and the second axis.

37. The mirror device according to claim 1, wherein an outer edge of the pair of torsion bars and an outer edge of the movable portion are connected to each other so that a curvature is continuous when viewed from a direction perpendicular to the first axis and the second axis.

38. The mirror device according to claim 2, wherein an outer edge of the pair of torsion bars and an outer edge of the movable portion are connected to each other so that a curvature is continuous when viewed from a direction perpendicular to the first axis and the second axis.

39. The mirror device according to claim 1, wherein the movable portion is provided with a first slit and a second slit, the first slit located between one of the pair of torsion bars and the mirror unit when viewed from a direction perpendicular to the first axis and the second axis, the second slit located between the other of the pair of torsion bars and the mirror unit when viewed from a direction perpendicular to the first axis and the second axis.

40. The mirror device according to claim 2, wherein the movable portion is provided with a first slit and a second slit, the first slit located between one of the pair of torsion bars and the mirror unit when viewed from a direction perpendicular to the first axis and the second axis, the second slit located between the other of the pair of torsion bars and the mirror unit when viewed from a direction perpendicular to the first axis and the second axis.

41. The mirror device according to claim 23, further comprising:
a magnetic field generator; and
a coil provided to the support portion;
wherein a first center position of an extension region of the coil in a portion of the support portion connected to each of the pair of torsion bars is located on the outside in relation to a second center position of the corresponding portion, each of the first and second center positions being a center position of the width in a direction parallel to the first axis.

42. The mirror device according to claim 24, further comprising:
a magnetic field generator; and
a coil provided to the support portion;
wherein a first center position of an extension region of the coil in a portion of the support portion connected to each of the pair of torsion bars is located on the outside in relation to a second center position of the corresponding portion, each of the first and second center positions being a center position of the width in a direction parallel to the first axis.

43. The mirror device according to claim 23, further comprising:
a magnetic field generator; and
a coil provided to the support portion;
wherein the coil extends in a spiral shape while being embedded in the support portion.

44. The mirror device according to claim 24, further comprising:
a magnetic field generator; and
a coil provided to the support portion;
wherein the coil extends in a spiral shape while being embedded in the support portion.

45. The mirror device according to claim 1, wherein the mirror unit is provided with a beam structure.

46. The mirror device according to claim 2, wherein the mirror unit is provided with a beam structure.

47. The mirror device according to claim 45, wherein the beam structure includes a beam structure extending from a center position of the mirror unit toward each of the pair of first connection regions when viewed from a direction perpendicular to the first axis and the second axis.

48. The mirror device according to claim 46, wherein the beam structure includes a beam structure extending from a center position of the mirror unit toward each of the pair of first connection regions when viewed from a direction perpendicular to the first axis and the second axis.

49. The mirror device according to claim 23, wherein the support portion is provided with a beam structure, the beam structure extending in an annular shape along the frame-shaped support portion when viewed from a direction perpendicular to the first axis and the second axis, and
wherein a first width of a portion of the beam structure extending in a direction parallel to the second axis is smaller than a second width of a portion of the beam structure extending in a direction parallel to the first axis, the first width being a width in a direction parallel to the first axis, the second width being a width in a direction parallel to the second axis.

50. The mirror device according to claim 24, wherein the support portion is provided with a beam structure, the beam structure extending in an annular shape along the frame-shaped support portion when viewed from a direction perpendicular to the first axis and the second axis, and wherein a first width of a portion of the beam structure extending in a direction parallel to the second axis is smaller than a second width of a portion of the beam structure extending in a direction parallel to the first axis, the first width being a width in a direction parallel to the first axis, the second width being a width in a direction parallel to the second axis.

51. The mirror device according to claim 23, wherein the mirror unit and the support portion are provided with a beam structure.

52. The mirror device according to claim 24, wherein the mirror unit and the support portion are provided with a beam structure.

* * * * *